United States Patent
Kim et al.

(10) Patent No.: US 11,227,905 B2
(45) Date of Patent: Jan. 18, 2022

(54) DISPLAY DEVICE HAVING A CHARGE GENERATION LAYER

(71) Applicant: LG Display Co., Ltd., Seoul (KR)

(72) Inventors: YoungMi Kim, Paju-si (KR); Wooram Youn, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/700,152

(22) Filed: Dec. 2, 2019

(65) Prior Publication Data
US 2020/0185469 A1    Jun. 11, 2020

(30) Foreign Application Priority Data
Dec. 7, 2018  (KR) .................. 10-2018-0157116

(51) Int. Cl.
*H01L 27/32*        (2006.01)

(52) U.S. Cl.
CPC ........ *H01L 27/3246* (2013.01); *H01L 27/322* (2013.01)

(58) Field of Classification Search
CPC ............. H01L 27/3246; H01L 27/3218; H01L 51/5203
See application file for complete search history.

(56) References Cited

U.S. PATENT DOCUMENTS

2018/0122875 A1* 5/2018 Bang ................... H01L 51/5203
2018/0190731 A1   7/2018 Park et al.

FOREIGN PATENT DOCUMENTS

KR    10-2018-0079059 A    7/2018

* cited by examiner

*Primary Examiner* — Suberr L Chi
(74) *Attorney, Agent, or Firm* — Morgan, Lewis & Bockius LLP

(57) ABSTRACT

A display device is disclosed, which is capable of preventing a leakage current between neighboring pixels. The display device includes a substrate including a first sub pixel and a second sub pixel, first electrodes patterned in the respective first and second sub pixel on the substrate, a bankwall provided between the first electrodes, a bank provided to cover an end of the first electrode and configured to expose some portions of the first electrode, an emission layer provided on the bankwall and the bank, and configured to include a first stack, a second stack, and a charge generation layer disposed between the first stack and the second stack, and a second electrode provided on the emission layer, wherein the emission layer includes a disconnected area in which the charge generation layer is disconnectedly provided by the bankwall.

18 Claims, 16 Drawing Sheets

DISPLAY DEVICE HAVING A CHARGE GENERATION LAYER

This application claims the benefit of Korean Patent Application No. 10-2018-0157116, filed in Korea on Dec. 7, 2018, which is hereby incorporated by reference.

BACKGROUND

Technical Field

The present disclosure relates to a display device configured to display an image.

Discussion of the Related Art

With the advancement of an information-oriented society, requirements for a display device of displaying an image are increasing in various types. Recently, various display devices such as liquid crystal display (LCD), plasma display panel (PDP) and organic light emitting display (OLED) have been utilized.

Among the display devices, the OLED device is a self light emitting display device. In comparison to the LCD device, the OLED device has wider viewing angle and greater contrast ratio. Also, the OLED device may be fabricated at a lightweight and slim size as they do not need a separate backlight unlike the LCD device, and furthermore the OLED device is favorable in view of power consumption. In addition, the OLED device may be driven by a low D.C. voltage, and a response speed in the OLED device is rapid. Especially, the OLED device may have the advantage of low manufacturing cost.

The OLED device may be formed in a tandem structure of two or more stacks comprising two or more emission layers deposited. In this case, the two or more stacks are formed as a common layer, whereby a current of any one pixel may leak into the neighboring pixel. Thus, this leakage current causes deterioration of a color realization ratio in the neighboring pixel.

Recently, a head mounted display (HMD) device comprising the above display device has been developed. The head mounted display (HMD) device, which is worn as part of glasses or helmet, is an eyeglass-type monitor device of virtual reality (VR) or augmented reality (AR) in which a focus is formed within a short distance in front of user's eyes. However, in case of a ultra-high definition head mounted display (HMD) device, an interval between pixels is very compact, whereby the neighboring pixel may be largely influenced by the leakage current.

SUMMARY

Accordingly, embodiments of the present disclosure are directed to a display device that substantially obviates one or more of the problems due to limitations and disadvantages of the related art.

An aspect of the present disclosure is to provide a display device capable of preventing a leakage current between neighboring pixels.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a substrate including a first sub pixel and a second sub pixel, first electrodes patterned in the respective first and second sub pixel on the substrate, a bankwall provided between the first electrodes, a bank provided to cover an end of the first electrode and configured to expose some portions of the first electrode, an emission layer provided on the bankwall and the bank, and configured to include a first stack, a second stack, and a charge generation layer disposed between the first stack and the second stack, and a second electrode provided on the emission layer, wherein the emission layer includes a disconnected area in which the charge generation layer is disconnectedly provided by the bankwall.

According to the present disclosure, the charge generation layer of the emission layer may be disconnectedly provided by the use of bankwall. Thus, it is possible to prevent or reduce an occurrence of a leakage current between neighboring sub pixels.

Also, according to the present disclosure, the bankwall has an appropriate width and height so that the disconnected area, in which the charge generation layer of the emission layer is disconnectedly provided, is formed in a non-emission area, and the first stack, the charge generation layer, and the second stack included in the emission layer are uniformly deposited in an emission area. Accordingly, it is possible to prevent non-emission portions from being formed in the emission area, and to realize a uniform luminance.

In addition to the effects of the present disclosure as mentioned above, additional advantages and features of the present disclosure will be clearly understood by those skilled in the art from the description of the present disclosure.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
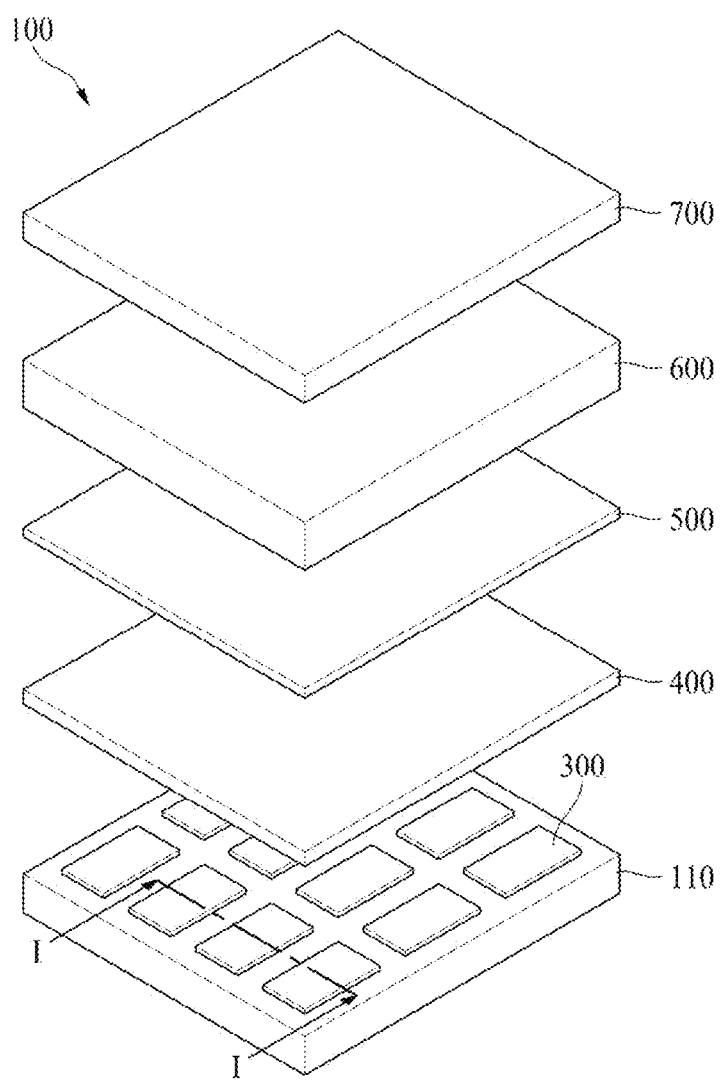
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship of two portions is described as 'upon~', 'above~', 'below~', and 'next to~', one or more portions may be arranged between these two portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "X-axis direction," "Y-axis direction," and "Z-axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of the present disclosure will be described in detail with reference to the accompanying drawings.

First Embodiment

Figure 2:
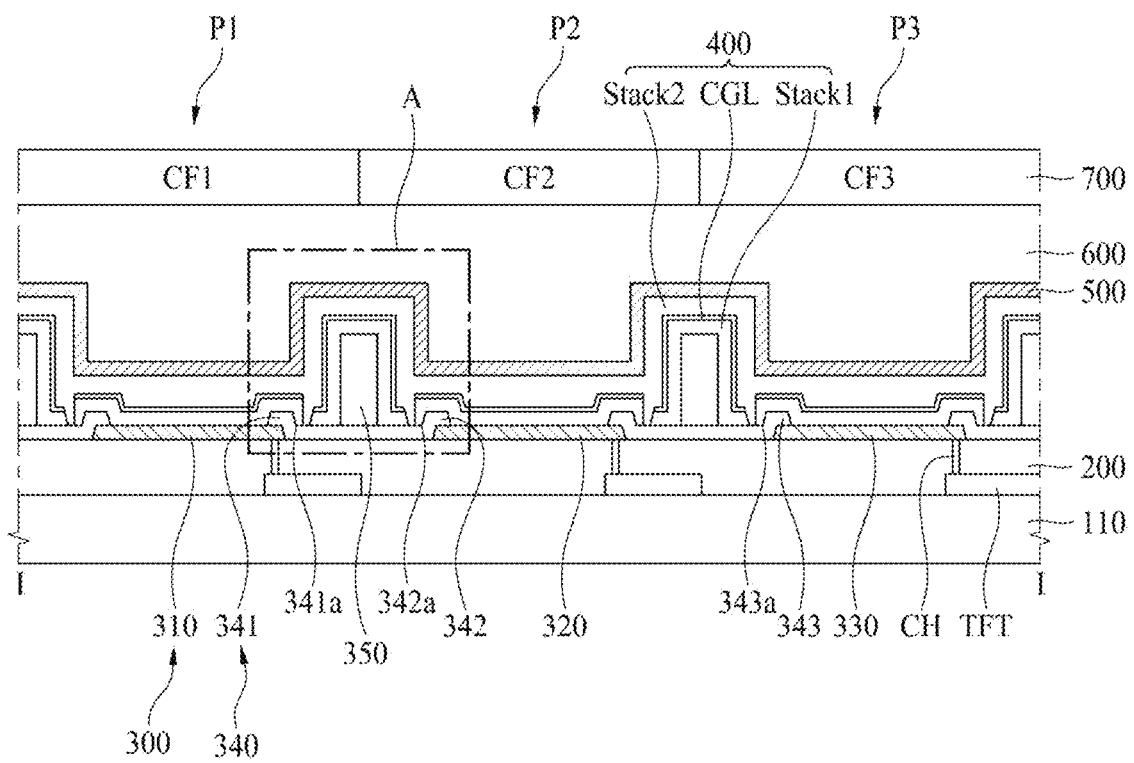
FIG. 2 is a cross sectional view illustrating a first embodiment along I-I of FIG. 1.
Figure 3:
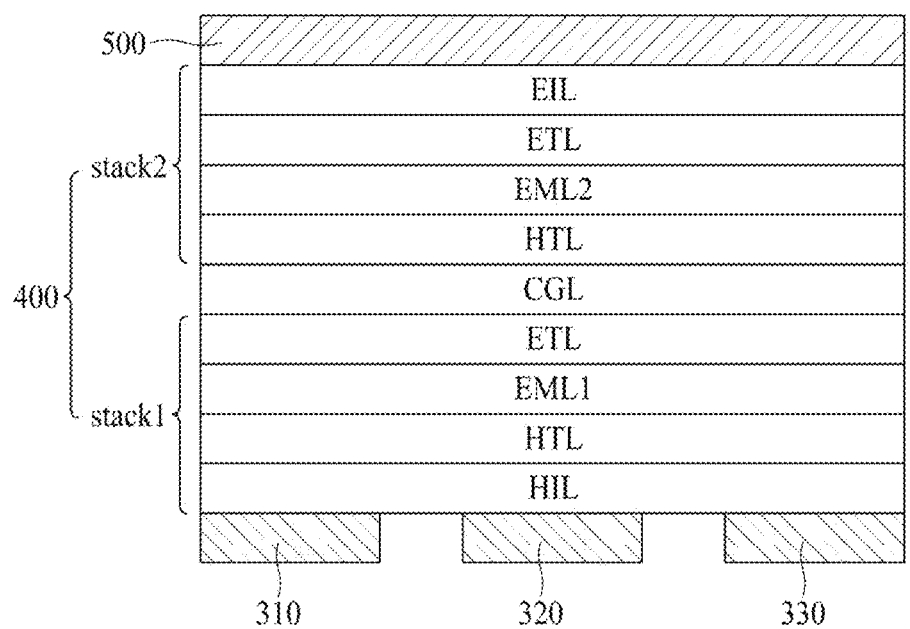
FIG. 3 is a cross sectional view illustrating a detailed example of a first electrode and an emission layer in the display device according to one embodiment of the present disclosure.
Figure 4:
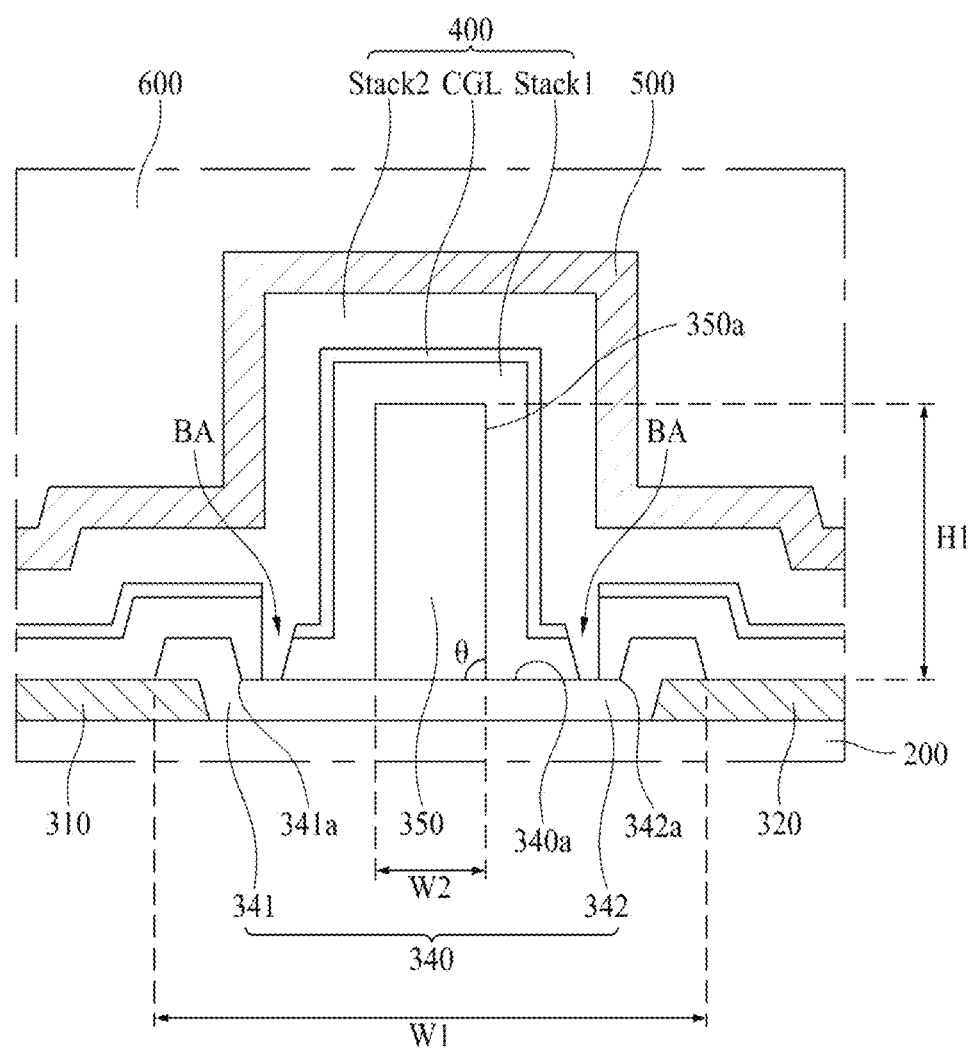
FIG. 4 is an expanded view illustrating "A" of FIG. 2.
Figure 5:
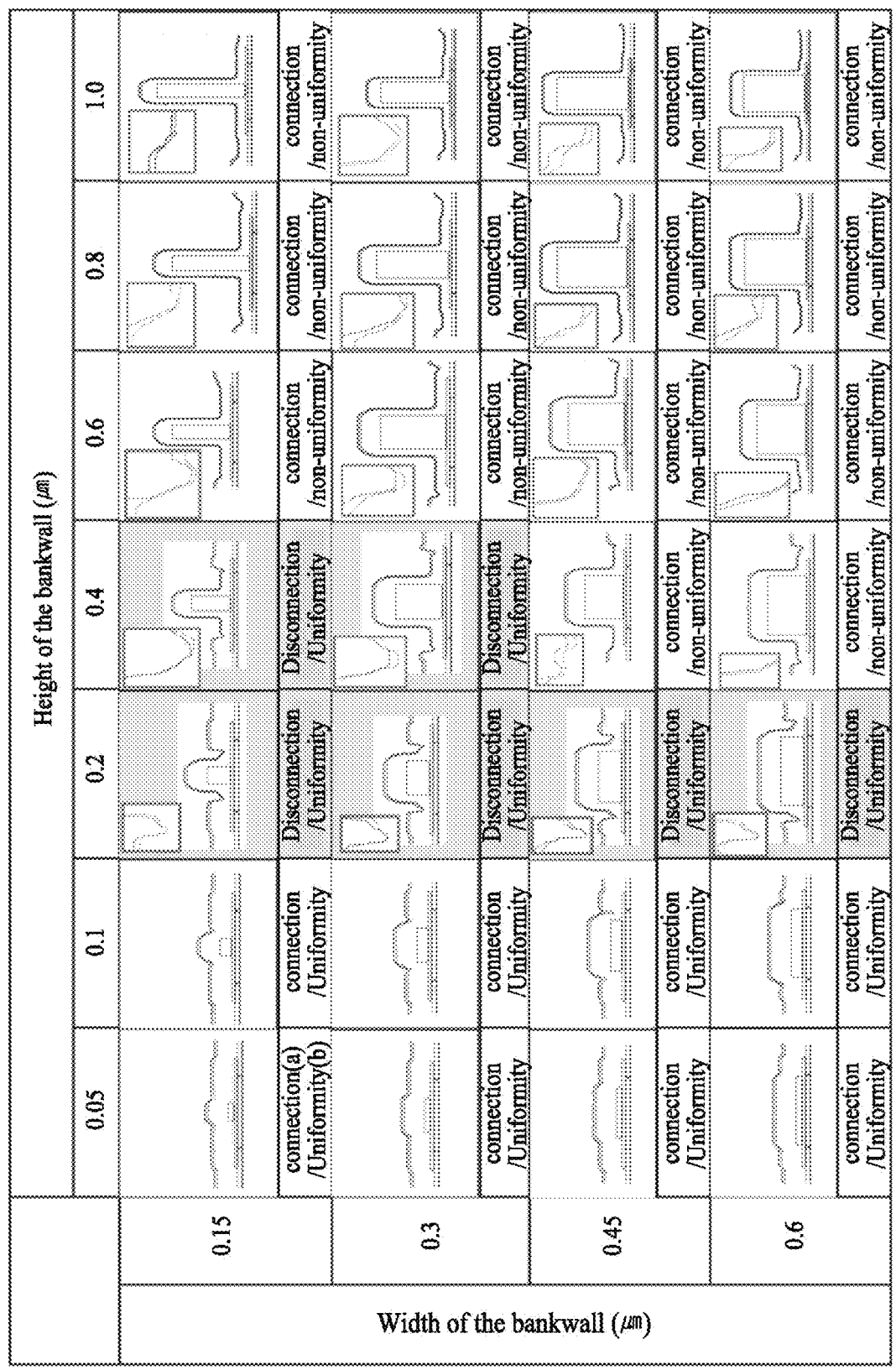
FIG. 5 illustrates simulation results in accordance with width and height of a bankwall in the display device according to the first embodiment of the present disclosure.

FIG. 1 is a perspective view illustrating a display device according to one embodiment of the present disclosure. FIG. 2 is a cross sectional view illustrating a first embodiment along I-I of FIG. 1. FIG. 3 is a cross sectional view illustrating a detailed example of a first electrode and an emission layer in the display device according to one embodiment of the present disclosure. FIG. 4 is an expanded view illustrating "A" of FIG. 2. FIG. 5 illustrates simulation results in accordance with width and height of a bankwall in the display device according to the first embodiment of the present disclosure.

Referring to FIGS. 1 to 4, the display device 100 according to one embodiment of the present disclosure includes a substrate 110, a circuit device layer 200, a first electrode 300, a bank 340, a bankwall 350, an emission layer 400, a second electrode 500, an encapsulation layer 600, and a color filter 700.

The substrate 110 may be formed of a plastic film, a glass substrate, or a silicon wafer substrate formed by a semiconductor process. The substrate 110 may be formed of a transparent material or an opaque material. On the substrate 110, there are a first pixel (P1) configured to emit red (R) colored light, a second pixel (P2) configured to emit green (G) colored light, and a third pixel (P3) configured to emit blue (B) colored light, but not limited to this structure. A fourth pixel configured to emit white (W) colored light may be additionally provided on the substrate 110. Also, an arrangement order of the respective pixels (P1, P2, P3) may be changed in various ways.

The display device 100 according to one embodiment of the present disclosure may be formed in a top emission type where emitted light advances upwardly, but not limited to this type. If the display device 100 is formed in the top emission type, the substrate 110 may be formed of an opaque material as well as a transparent material. Meanwhile, if the display device 100 according to one embodiment of the present disclosure is formed in a bottom emission type, the substrate 110 may be formed of a transparent material.

The circuit device layer 200 is provided on the substrate 110.

In the circuit device layer 200, a circuit device comprising various signal lines, thin film transistors, and a capacitor is provided by each sub pixel (P1, P2, P3). The signal lines may include a gate line, a data line, a power line, and a reference line, and the thin film transistors may include a switching thin film transistor, a driving thin film transistor (TFT), and a sensing thin film transistor.

The switching thin film transistor is switched by a gate signal supplied to the gate line, and the switching thin film transistor supplies a data voltage, which is supplied from the data line, to the driving thin film transistor (TFT).

The driving thin film transistor (TFT) is switched by the data voltage supplied from the switching thin film transistor, and the driving thin film transistor (TFT) generates a data current from power source supplied from the power line, and supplies the data current to the first electrode 300.

The sensing thin film transistor senses a deviation of threshold voltage in the driving thin film transistor (TFT), which causes a deterioration of picture quality. The sensing thin film transistor supplies a current of the driving thin film transistor (TFT) to the reference line in response to a sensing control signal supplied from the gate line or an additional sensing line.

The capacitor maintains the data voltage supplied to the driving thin film transistor (TFT) for one frame period, and the capacitor is connected with each of gate and source terminals of the driving thin film transistor (TFT).

In the circuit device layer 200, there may be an insulating film (not shown) provided between the thin film transistor and the first electrode 300. In more detail, the circuit device layer 200 may include at least one of a protection film (not shown) for protecting the thin film transistor, and a planarization film (not shown) for planarizing a step difference caused by the thin film transistor.

Also, a contact hole (CH) which penetrates through the protection film and the planarization film may be provided in the circuit device layer 200 by each sub pixel (P1, P2, P3). Through the contact hole (CH), a source terminal or drain terminal of the driving thin film transistor (TFT) may be exposed. The contact hole (CH) may be provided in a non-emission area which is overlapped with the bank 340, as shown in the drawings, but not limited to this structure. If the display device 100 is formed in the top emission type, the contact hole (CH) may be provided in an emission area which is not overlapped with the bank 340.

The first electrode 300 is patterned by each sub pixel (P1, P2, P3) on the circuit device layer 200. One of the first electrode 310 is patterned in the first sub pixel (P1), another first electrode 320 is patterned in the second sub pixel (P2), and another first electrode 330 is patterned in the third sub pixel (P3).

The first electrode 310, 320 and 330 is connected with the driving thin film transistor (TFT) provided in the circuit device layer 200. In detail, the first electrode 310, 320 and 330 is connected with the source terminal or drain terminal of the driving thin film transistor (TFT) via the contact hole provided in the circuit device layer 200.

The first electrode 310, 320 and 330 may be formed of a transparent metal material, a semi-transmissive metal material, or a metal material with high reflectance. If the display device 100 is formed in the top emission type, the first electrode 310, 320 and 330 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper, (Cu), and etc. If the display device 100 is formed in the bottom emission type, the first electrode 310, 320 and 330 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). The first electrode 310, 320 and 330 may be an anode electrode.

The bank 340 may be provided to cover an end of each first electrode 310, 320 and 330 on the circuit device layer 200. Accordingly, it is possible to prevent a current from being concentrated on the end of the first electrode 310, 320 and 330, to thereby prevent a problem related with a deterioration of an emission efficiency.

Also, the bank 340 is connected from the end of one first electrode 310 to the end of another first electrode 320, and may be connected from the end of another first electrode 320 to the end of another first electrode 330. That is, the bank 340 covers the end of each first electrode 310, 320 and 330, and also covers the circuit device layer 200.

In detail, the bank 340 may include a first bank 341 provided to cover the periphery of the first electrode 310 of the first sub pixel (P1), a second bank 342 provided to cover the periphery of the first electrode 320 of the second sub pixel (P2), and a third bank 343 provided to cover the periphery of the first electrode 330 of the third sub pixel (P3).

In the display device 100 according to the first embodiment of the present disclosure, the first bank 341 and the second bank 342 are connected with each other, and formed as one body. One end of the first bank 341 is provided to cover the end of the first electrode 310 provided in the first sub pixel (P1), and the other end is connected with the second bank 342 between the first sub pixel (P1) and the second sub pixel (P2). One end of the second bank 342 is connected with the first bank 341 between the first sub pixel (P1) and the second sub pixel (P2), and the other end is provided to cover the end of the first electrode 320 provided in the second sub pixel (P2). Accordingly, the first bank 341 and the second bank 342 cover the end of each first electrode 310 and 320, and also cover the circuit device layer 200 which is exposed via the space between the first sub pixel (P1) and the second sub pixel (P2), whereby the circuit device layer 200 is not exposed.

Also, in the display device 100 according to the first embodiment of the present disclosure, the second bank 342 and the third bank 343 are connected with each other, and formed as one body. One end of the second bank 342 is provided to cover the end of the first electrode 320 provided in the second sub pixel (P2), and the other end is connected with the third bank 343 between the second sub pixel (P2) and the third sub pixel (P3). One end of the third bank 343 is connected with the second bank 342 between the second sub pixel (P2) and the third sub pixel (P3), and the other end is provided to cover the end of the first electrode 330 provided in the third sub pixel (P3). Accordingly, the second bank 342 and the third bank 343 cover the end of each first electrode 320 and 330, and also cover the circuit device layer 200 which is exposed via the space between the second sub pixel (P2) and the third sub pixel (P3), whereby the circuit device layer 200 is not exposed.

The bank 340 defines the emission area in each of the plurality of sub pixels (P1, P2, P3). That is, an exposed area of the first electrode 310, 320 and 330, which is exposed without being covered by the bank 340 in each sub pixel (P1, P2, P3), becomes the emission area. The bank 340 may be formed of an inorganic insulating film with a relatively small thickness, but not limited to this type. The bank 340 may be formed of an organic insulating film.

The bankwall 350 is formed on the bank 340. In this case, the bankwall 350 is formed between each of the first electrodes 310, 320 and 330. The bankwall 350 is appropriate for forming a disconnected area (BA), in which a first stack (Stack1) of the emission layer 400, and more particularly, a first emission layer (EML1) and a charge generation layer (CGL) are disconnectedly provided, on the bank 340 provided between the sub pixels (P1, P2, P3).

In an exemplary embodiment, the bankwall 350 is appropriate for forming a disconnected area (BA), in which a first stack (Stack1) of the emission layer 400, and more particularly, a first emission layer (EML1) and a charge generation layer (CGL) are disconnectedly provided, on the bank 340 provided between the sub pixels (P1, P2, P3), by means of having an appropriate width and/or height.

FIG. 5 shows simulation results in accordance with a width (W2) of the bankwall 350 and a height (H1) of the bankwall 350 in the display device 100 according to the first embodiment of the present disclosure. In this case, simulations may be performed under the fixing conditions of that a width (W1) of the bank 340 corresponds to 0.97 μm, a thickness of the bank 340 corresponds to 0.03 μm, and a width of the emission area, that is, a width of the first electrode 310, 320 and 330, which is exposed without being covered by the bank 340, corresponds to 1.45 μm.

Referring to FIG. 5, the bankwall 350 may have the width (W2) which is smaller than the width (W1) of the bank 340. According to one embodiment of the present disclosure, the width (W2) of the bankwall 350 may be ⅕ to ⅔ of the width (W1) of the bank 340.

If the width (W2) of the bankwall 350 is smaller than ⅕ of the width (W1) of the bank 340 or larger than ⅔ of the width (W1) of the bank 340, the first stack (Stack1) and the charge generation layer (CGL) of the emission layer 400 may be connectedly provided between the sub pixels (P1, P2, P3). Also, the first stack (Stack1) and the charge generation layer (CGL) of the emission layer 400 may be non-uniformly deposited in the emission area. Thus, a leakage current may be generated between the neighboring sub pixels (P1, P2, P3), and a luminance may be non-uniform in the sub pixel (P1, P2, P3).

In the display device 100 according to the first embodiment of the present disclosure, the width (W2) of the bankwall 350 may be ⅕ to ⅔ of the width (W1) of the bank 340 so that it is possible to prevent a leakage current, and to realize a uniform luminance.

Also, the bankwall 350 may have the height (H1) which is smaller than the width (W1) of the bank 340. According to one embodiment of the present disclosure, the height (H1) of the bankwall 350 may be 1/10 to ½ of the width (W1) of the bank 340. If the height (H1) of the bankwall 350 is smaller than 1/10 of the width (W1) of the bank 340, the first stack (Stack1) and the charge generation layer (CGL) of the emission layer 400 may be connectedly provided between the sub pixels (P1, P2, P3). Meanwhile, if the height (H1) of the bankwall 350 is larger than ½ of the width (W1) of the bank 340, the first stack (Stack1) and the charge generation layer (CGL) included in the emission layer 400 may be disconnectedly provided on the first electrode 310, 320 and 330 which is exposed without being covered by the bank 340. That is, the disconnected area (BA), in which the first stack (Stack1) and the charge generation layer (CGL) included in the emission layer 400 are disconnectedly provided, is generated in the emission area, and thus the light emission is not generated in some portions of the emission area, whereby a defect might occur.

In the display device 100 according to the first embodiment of the present disclosure, the height (H1) of the bankwall 350 is 1/10 to ½ of the width (W1) of the bank 340, whereby the first stack (Stack1) and the charge generation layer (CGL) included in the emission layer 400 are disconnectedly provided in the non-emission area, to thereby prevent an occurrence of a leakage current.

Meanwhile, the bankwall 350 may have an inclination angle (θ) of 60° to 90°. Herein, the inclination angle indicates an angle obtained between a lateral surface 350a of the bankwall 350 and an upper surface 340a of the bank 340.

If the inclination angle (θ) of the bankwall 350 is less than 60°, the angle between the bankwall 350 and the bank 340 is gentle so that the first stack (Stack1) and the charge generation layer (CGL) of the emission layer 400 deposited on the bankwall 350 and the bank 340 may be connectedly provided. That is, the disconnected area (BA), in which the first stack (Stack1) and the charge generation layer (CGL) included in the emission layer 400 are provided disconnectedly, is not generated.

Meanwhile, if the inclination angle (θ) of the bankwall 350 is larger than 90°, the bankwall 350 has a reversed tapered structure so that the first stack (Stack1) and the charge generation layer (CGL) of the emission layer 400 may be disconnectedly provided on the bankwall 350. If the bankwall 350 has the reversed tapered structure, a second stack (Stack1) of the emission layer 400 and the second electrode 500 may be disconnectedly provided on the bankwall 350. In this case, the second electrode 500 may be disconnectedly provided on the bankwall 350, and may be provided on the charge generation layer (CGL) exposed without being covered by the second emission layer (EML2). Accordingly, the second electrode 500 and the charge generation layer (CGL) are electrically connected with each other, whereby a defect might occur.

The bankwall 350 may be formed of an inorganic material, for example, silicon nitride, aluminum nitride, zirconium nitride, titanium nitride, hafnium nitride, tantalum nitride, silicon oxide, aluminum oxide, or titanium oxide, but not limited to these materials. The bankwall 350 may be formed of an organic material, for example, acryl resin, epoxy resin, phenolic resin, polyamide resin, or polyimide resin.

In another way, the bankwall 350 may be formed of a metal material with high reflectance, for example, aluminum (Al). If the bankwall 350 is formed of the metal material, light transferred from any one sub pixel to another neighboring sub pixel is reflected on the bankwall 350 in the display device 100 according to the first embodiment of the present disclosure so that it is possible to prevent the light from being mixed between the sub pixels (P1, P2, P3). Also, light emitted from the sub pixel (P1, P2, P3) is reflected toward a front direction so that it is possible to improve a light efficiency and to reduce a power consumption.

The emission layer 400 is formed on the first electrode 310, 320 and 330, the bank 340, and the bankwall 350. The emission layer 400 may be a white emission layer configured to emit white colored light. In this case, the emission layer 400 may be a common layer provided for the sub pixels (P1, P2, P3) in common.

As shown in FIG. 3, the emission layer 400 may include the first stack (Stack1) configured to emit first colored light, the second stack (Stack2) configured to emit second colored light, and the charge generation layer (CGL) disposed between the first stack and the second stack.

The first stack (Stack1) is provided on the first electrode 310, 320 and 330. The first stack (Stack1) may be formed in a deposition structure obtained by sequentially depositing a hole injecting layer (HIL), a hole transporting layer (HTL), a first emitting layer (EML1) configured to emit first colored light, and an electron transporting layer (ETL), but not limited to this structure. The first emitting layer (EML1) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The second stack (Stack2) is provided on the charge generation layer (CGL). The second stack (Stack2) may be formed in a deposition structure obtained by sequentially depositing a hole transporting layer (HTL), a second emitting layer (EML2) configured to emit second colored light, an electron transporting layer (ETL), and an electro injecting layer (EIL), but not limited to this structure. The second emitting layer (EML2) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The second emitting layer (EML2) may emit light whose color is different from that of the first emitting layer (EML1). For example, the first emitting layer (EML1) may be the blue emitting layer configured to emit the blue colored light, and the second emitting layer (EML2) may be the yellow emitting layer configured to emit the yellow colored light. In another way, the first emitting layer (EML1) may be the blue emitting layer configured to emit the blue colored light, and the second emitting layer (EML2) may be the red emitting layer configured to emit the red colored light, and the green emitting layer configured to emit the green colored light.

The charge generation layer (CGL) may be formed in a deposition structure obtained by depositing an N-type charge generation layer for providing an electron to the first stack (Stack1), and a P-type charge generation layer for providing a hole to the second stack (Stack2).

The emission layer 400 may be provided with the disconnected area (BA) in which the first stack (Stack1) and the charge generation layer (CGL) are disconnectedly provided due to the step difference H1 of the bankwall 350. In this case, the disconnected area (BA) may be provided on the bank 340. In more detail, each of the first to third banks 341, 342 and 343 may include a groove portion 341a, 342a and 343a which is formed by the step difference of the first electrode 310, 320 and 330. The groove portion 341a, 342a and 343a in each of the first to third banks 341, 342 and 343 induces the formation of disconnected area (BA) between the groove portion 341a, 342a and 343a and the bankwall 350, instead of the formation of disconnected area (BA) on the first electrode 310, 320 and 330.

Also, the first stack (Stack1) and the charge generation layer (CGL) included in the emission layer 400 may cover the bankwall 350, and may be disconnected at a predetermined point corresponding to an extending point by a predetermined length from the bankwall 350 to the first electrode 310, 320 and 330. That is, the disconnected area (BA) may be spaced apart from the bankwall 350.

Meanwhile, the second stack (Stack2) of the emission layer 400 may be connectedly provided in the disconnected area (BA). That is, unlike the first stack (Stack1) and the charge generation layer (CGL), the second stack (Stack2) of the emission layer 400 may be connectedly provided between the sub pixels (P1, P2, P3) without being disconnectedly provided.

The second electrode 500 is formed on the emission layer 400. The second electrode 500 may be a common layer provided for the sub pixels (P1, P2, P3) in common.

The second electrode 500 may be formed of a transparent metal material, a semi-transmissive metal material, or a metal material with high reflectance. If the display device 100 is formed in the top emission type, the second electrode 500 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). If the display device 100 is formed in the bottom emission type, the second electrode 500 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper, (Cu), and etc. The second electrode 500 may be a cathode electrode.

The encapsulation layer 600 may cover the second electrode 500. The encapsulation layer 600 prevents oxygen or moisture from being permeated into the emission layer 400 and the second electrode 500. To this end, the encapsulation layer 600 may include at least one inorganic film and at least one organic film.

In detail, the encapsulation layer 600 may include a first inorganic film and an organic film. According to one embodiment of the present disclosure, the encapsulation layer 600 may further include a second inorganic film.

The first inorganic film may cover the second electrode 500. The organic film is provided on the first inorganic film. Preferably, the organic film has a length which is sufficient to prevent particles from being permeated into the emission layer 400 and the second electrode 500 through the first inorganic film. The second inorganic film is provided to cover the organic film.

Each of the first inorganic film and the second inorganic film may be formed of silicon nitride, aluminum nitride, zirconium nitride, titanium nitride, hafnium nitride, tantalum nitride, silicon oxide, aluminum oxide, or titanium oxide. The first and second inorganic films may be deposited by a chemical vapor deposition (CVD) method or an atomic layer deposition (ALD) method, but not limited to these methods.

The organic film may be formed of acryl resin, epoxy resin, phenolic resin, polyamide resin, or polyimide resin. The organic film may be obtained by a vapor deposition method, a printing method, or a slit coating method, but not limited to these methods. The organic film may be obtained by an ink-jet method.

The color filter 700 is formed on the encapsulation layer 600. The color filter 700 may include a first color filter (CF1), a second color filter (CF2), and a third color filter (CF3) which are respectively disposed in the sub pixels (P1, P2, P3). The first color filter (CF1) may be a red color filter for transmitting red colored light therethrough, the second color filter (CF2) may be a green color filter for transmitting green colored light therethrough, and the third color filter (CF3) may be a blue color filter for transmitting blue colored light therethrough.

In the display device 100 according to the first embodiment of the present disclosure, the first stack (Stack1) and the charge generation layer (CGL) included in the emission layer 400 may be disconnectedly provided in the non-emission area by the use of bankwall 350, whereby it is possible to prevent a leakage current between the neighboring sub pixels (P1, P2, P3). Hereinafter, modified embodiments of the display device 100 according to the first embodiment of the present disclosure will be described as follows.

Second Embodiment

Figure 6:
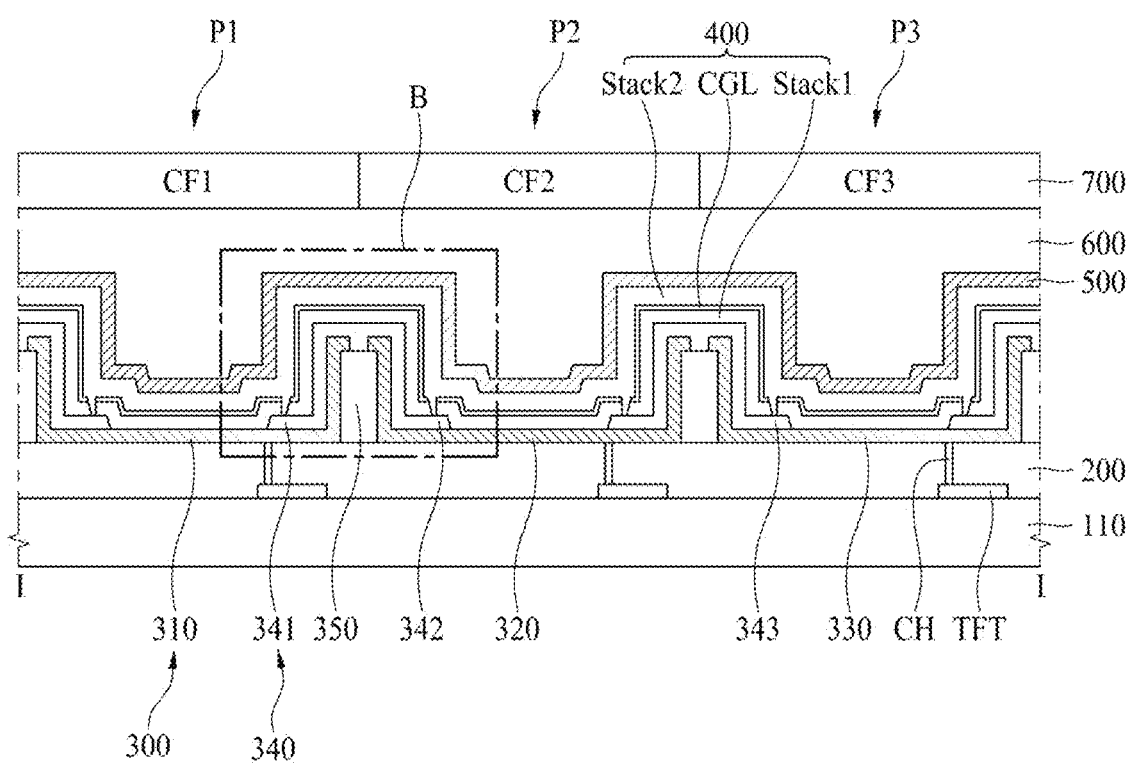
FIG. 6 is a cross sectional view illustrating a second embodiment along I-I of FIG. 1.
Figure 7:
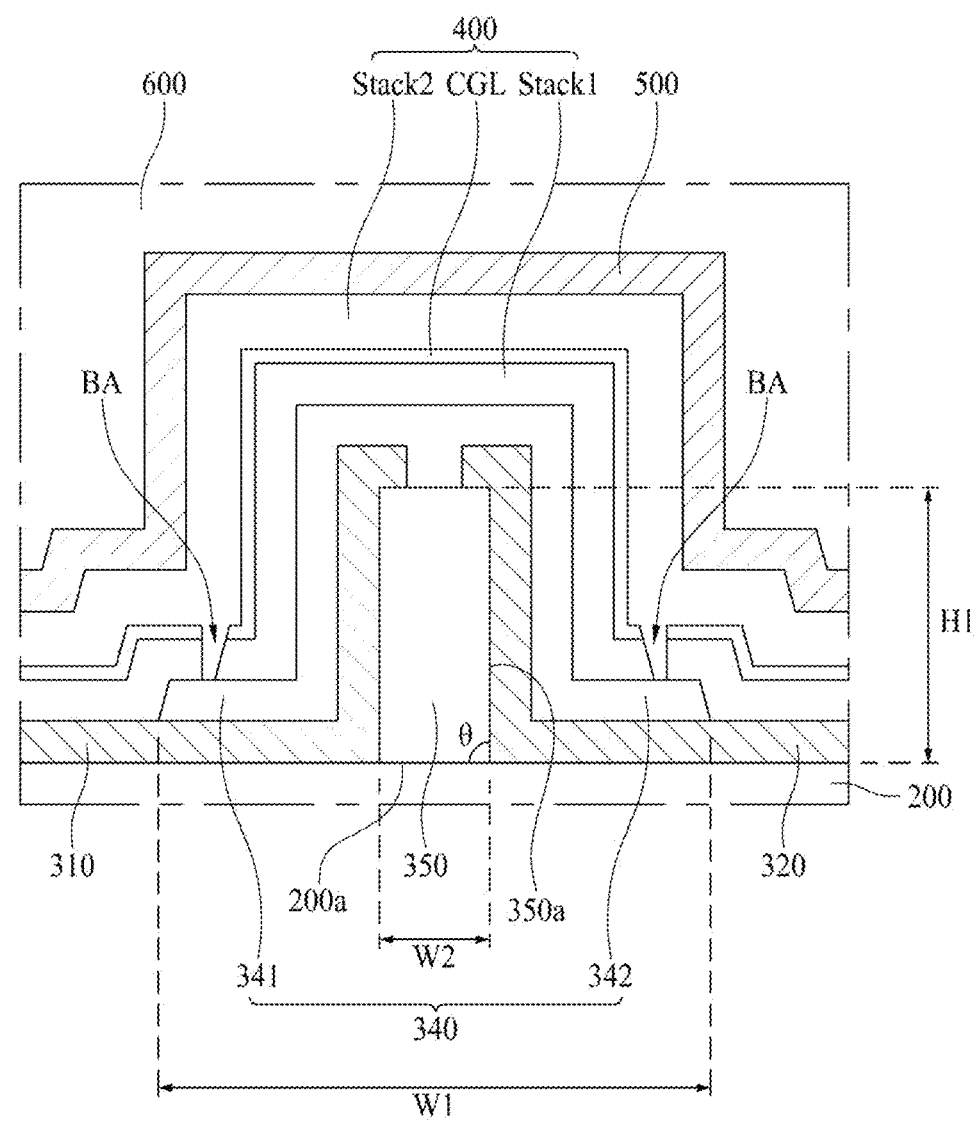
FIG. 7 is an expanded view illustrating "B" of FIG. 6.
Figure 8:
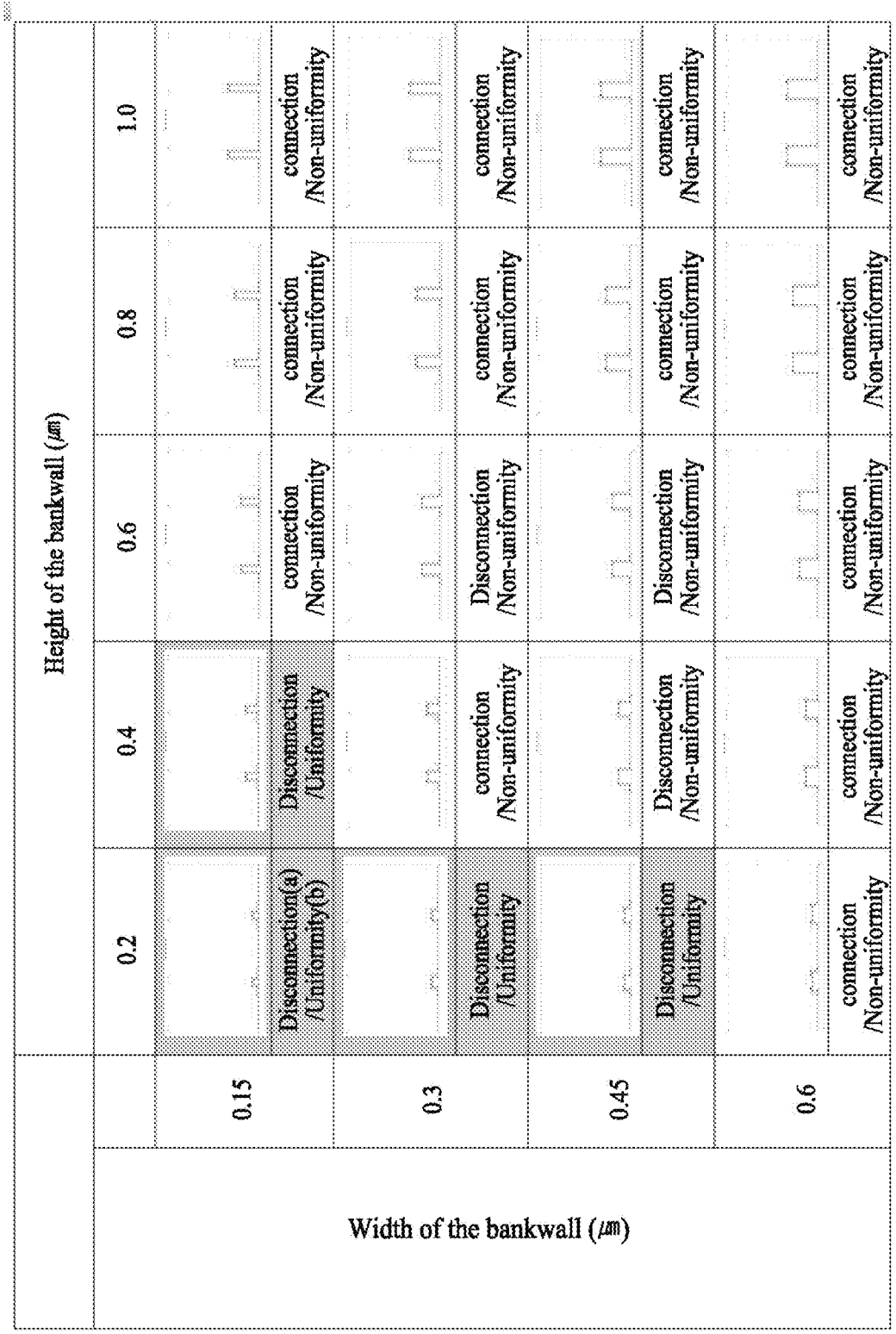
FIG. 8 illustrates simulation results in accordance with width and height of a bankwall in the display device according to the second embodiment of the present disclosure.

FIG. 6 is a cross sectional view illustrating a second embodiment along I-I of FIG. 1. FIG. 7 is an expanded view illustrating "B" of FIG. 6. FIG. 8 illustrates simulation results in accordance with width and height of a bankwall in the display device according to the second embodiment of the present disclosure.

Referring to FIGS. 6 to 8, the display device 100 according to the second embodiment of the present disclosure includes a substrate 110, a circuit device layer 200, a first electrode 300, a bank 340, a bankwall 350, an emission layer 400, a second electrode 500, an encapsulation layer 600, and a color filter 700.

Except the first electrode 300, the bank 340, the bankwall 350, and the emission layer 400, other structures of the display device 100 according to the second embodiment of the present disclosure are the same as those of the display device according to the first embodiment of the present disclosure shown in FIGS. 1 to 4. Hereinafter, a detailed description for the substrate 110, the circuit device layer 200, the second electrode 500, the encapsulation layer 600, and the color filter 700 in the display device 100 according to the second embodiment of the present disclosure will be omitted.

The bankwall 350 is formed on the circuit device layer 200. In this case, the bankwall 350 is formed between each of the first electrodes 310, 320 and 330, and also formed below the first electrodes 310, 320 and 330. The bankwall 350 is appropriate for forming a disconnected area (BA), in which a first stack (Stack1) of the emission layer 400, and more particularly, a first emission layer (EML1) and a charge generation layer (CGL) are disconnectedly provided, on the bank 340 provided between the sub pixels (P1, P2, P3).

In an exemplary embodiment, the bankwall 350 is appropriate for forming a disconnected area (BA), in which a first stack (Stack1) of the emission layer 400, and more particularly, a first emission layer (EML1) and a charge generation layer (CGL) are disconnectedly provided, on the bank 340 provided between the sub pixels (P1, P2, P3), by means of having an appropriate width and/or height.

FIG. 8 shows simulation results in accordance with a width (W2) of the bankwall 350 and a height (H1) of the bankwall 350 in the display device 100 according to the second embodiment of the present disclosure. In this case, simulations may be performed under the fixing conditions of that a width (W1) of the bank 340 corresponds to 0.97 μm, a thickness of the bank 340 corresponds to 0.03 μm, and a width of the emission area, that is, a width of the first electrode 310, 320 and 330, which is exposed without being covered by the bank 340, corresponds to 1.45 μm.

Referring to FIG. 8, the bankwall 350 may have the width (W2) which is smaller than the width (W1) of the bank 340. According to one embodiment of the present disclosure, the width (W2) of the bankwall 350 may be ⅒ to ½ of the width (W1) of the bank 340.

If the width (W2) of the bankwall 350 is smaller than ⅒ of the width (W1) of the bank 340 or larger than ½ of the width (W1) of the bank 340, the first stack (Stack1) and the charge generation layer (CGL) of the emission layer 400 may be connectedly provided between the sub pixels (P1, P2, P3). Also, the first stack (Stack1) and the charge generation layer (CGL) of the emission layer 400 may be non-uniformly deposited in the emission area. Thus, a leakage current may be generated between the neighboring sub pixels (P1, P2, P3), and a luminance may be non-uniform in the sub pixel (P1, P2, P3).

In the display device 100 according to the second embodiment of the present disclosure, the width (W2) of the bankwall 350 may be ⅒ to ½ of the width (W1) of the bank 340 so that it is possible to prevent a leakage current, and to realize a uniform luminance.

Also, the bankwall 350 may have the height (H1) which is smaller than the width (W1) of the bank 340. According to one embodiment of the present disclosure, the height (H1) of the bankwall 350 may be ⅒ to ½ of the width (W1) of the bank 340. If the height (H1) of the bankwall 350 is smaller than ⅒ of the width (W1) of the bank 340, the first stack (Stack1) and the charge generation layer (CGL) of the emission layer 400 may be connectedly provided between the sub pixels (P1, P2, P3). Meanwhile, if the height (H1) of the bankwall 350 is larger than ½ of the width (W1) of the bank 340, the first stack (Stack1) and the charge generation layer (CGL) included in the emission layer 400 may be disconnectedly provided on the first electrode 310, 320 and 330 which is exposed without being covered by the bank 340. That is, the disconnected area (BA), in which the first stack (Stack1) and the charge generation layer (CGL) included in the emission layer 400 are disconnectedly provided, is generated in the emission area, and thus the light emission is not generated in some portions of the emission area, whereby a defect might occur.

In the display device 100 according to the second embodiment of the present disclosure, the height (H1) of the bankwall 350 is ⅒ to ½ of the width (W1) of the bank 340, whereby the first stack (Stack1) and the charge generation layer (CGL) included in the emission layer 400 are disconnectedly provided in the non-emission area, to thereby prevent an occurrence of a leakage current.

Meanwhile, the bankwall 350 may have an inclination angle (θ) of 60° to 90°. Herein, the inclination angle indicates an angle obtained between a lateral surface 350a of the bankwall 350 and an upper surface 200a of the circuit device layer 200.

If the inclination angle (θ) of the bankwall is less than 60°, the angle between the bankwall 350 and the circuit device layer 200 is gentle so that the bank 340 formed on the bankwall 350 also has a gentle angle. Accordingly, the first stack (Stack1) and the charge generation layer (CGL) of the emission layer 400 deposited on the bank 340 may be connectedly provided. That is, the disconnected area (BA), in which the first stack (Stack1) and the charge generation layer (CGL) included in the emission layer 400 are provided disconnectedly, is not generated.

Meanwhile, if the inclination angle (θ) of the bankwall 350 is larger than 90°, the bankwall 350 has a reversed tapered structure so that the bank 340 formed on the bankwall 350, and the first stack (Stack1) and the charge generation layer (CGL) included in the emission layer 400 may be disconnectedly provided on the bankwall 350. Also, a second stack (Stack1) of the emission layer 400 and the second electrode 500 may be disconnectedly provided on the bankwall 350. In this case, the second electrode 500 may be disconnectedly provided on the bankwall 350, and may be provided on the charge generation layer (CGL) exposed without being covered by the second emission layer (EML2). Accordingly, the second electrode 500 and the charge generation layer (CGL) are electrically connected with each other, whereby a defect might occur.

The bankwall 350 may be formed of an inorganic material, for example, silicon nitride, aluminum nitride, zirconium nitride, titanium nitride, hafnium nitride, tantalum nitride, silicon oxide, aluminum oxide, or titanium oxide, but not limited to these materials. The bankwall 350 may be formed of an organic material, for example, acryl resin, epoxy resin, phenolic resin, polyamide resin, or polyimide resin.

Meanwhile, in case of the display device 100 according to the second embodiment of the present disclosure, the bankwall 350 can not be formed of a metal material, unlike the display device 100 according to the first embodiment of the present disclosure. This is because the first electrode 310, 320 and 330 is directly formed on the bankwall 350 in the display device 100 according to the second embodiment of the present disclosure.

The first electrode 300 is patterned by each sub pixel (P1, P2, P3) on the circuit device layer 200. One of the first electrode 310 is patterned in the first sub pixel (P1), another first electrode 320 is patterned in the second sub pixel (P2), and another first electrode 330 is patterned in the third sub pixel (P3).

The first electrode 310, 320 and 330 is connected with the driving thin film transistor (TFT) provided in the circuit device layer 200. In detail, the first electrode 310, 320 and 330 is connected with the source terminal or drain terminal of the driving thin film transistor (TFT) via the contact hole (CH) provided in the circuit device layer 200.

The first electrode 310, 320 and 330 may be formed of a transparent metal material, a semi-transmissive metal material, or a metal material with high reflectance. If the display device 100 is formed in the top emission type, the first electrode 310, 320 and 330 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper, (Cu), and etc. If the display device 100 is formed in the bottom emission type, the first electrode 310, 320 and 330 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). The first electrode 310, 320 and 330 may be an anode electrode.

In the display device 100 according to the second embodiment of the present disclosure, the first electrode 310, 320 and 330 may be formed on some portions of lateral and upper surfaces of the bankwall 350. If the first electrode 310, 320 and 330 is formed of the metal material with high reflectance, light transferred from any one sub pixel to another neighboring sub pixel is reflected on the first electrode 310, 320 and 330 formed on the lateral surface of the bankwall 350 so that it is possible to prevent the light from being mixed between the sub pixels (P1, P2, P3). Also, light emitted from the sub pixel (P1, P2, P3) is reflected toward a front direction so that it is possible to improve a light efficiency and to reduce a power consumption.

The bank 340 may be provided to cover the periphery of each first electrode 310, 320 and 330 on the first electrode 310, 320 and 330. Accordingly, it is possible to prevent a current from being concentrated on the periphery of the first electrode 310, 320 and 330, to thereby prevent a problem related with a deterioration of an emission efficiency.

Also, the bank 340 is connected from the end of one first electrode 310 to the end of another first electrode 320, and may be connected from the end of another first electrode 320 to the end of another first electrode 330. That is, the bank 340 covers the end of each first electrode 310, 320 and 330, and also covers the bankwall 350.

In detail, the bank 340 may include a first bank 341 provided to cover the periphery of the first electrode 310 of the first sub pixel (P1), a second bank 342 provided to cover the periphery of the first electrode 320 of the second sub pixel (P2), and a third bank 343 provided to cover the periphery of the first electrode 330 of the third sub pixel (P3).

In the display device 100 according to the second embodiment of the present disclosure, the first bank 341 and the second bank 342 are connected with each other, and formed as one body. One end of the first bank 341 is provided to cover the end of the first electrode 310 provided in the first sub pixel (P1), and the other end is connected with the second bank 342 between the first sub pixel (P1) and the second sub pixel (P2). One end of the second bank 342 is connected with the first bank 341 between the first sub pixel (P1) and the second sub pixel (P2), and the other end is provided to cover the end of the first electrode 320 provided in the second sub pixel (P2). Accordingly, the first bank 341 and the second bank 342 cover the end of each first electrode 310 and 320, and also cover the bankwall 350 which is exposed via the space between the first sub pixel (P1) and the second sub pixel (P2), whereby the bankwall 350 is not exposed.

Also, in the display device 100 according to the second embodiment of the present disclosure, the second bank 342 and the third bank 343 are connected with each other, and formed as one body. One end of the second bank 342 is provided to cover the end of the first electrode 320 provided in the second sub pixel (P2), and the other end is connected with the third bank 343 between the second sub pixel (P2) and the third sub pixel (P3). One end of the third bank 343 is connected with the second bank 342 between the second sub pixel (P2) and the third sub pixel (P3), and the other end is provided to cover the end of the first electrode 330 provided in the third sub pixel (P3). Accordingly, the second bank 342 and the third bank 343 cover the end of each first electrode 320 and 330, and also cover the bankwall 350 which is exposed via the space between the second sub pixel (P2) and the third sub pixel (P3), whereby the bankwall 350 is not exposed.

The bank 340 defines the emission area in each of the plurality of sub pixels (P1, P2, P3). That is, an exposed area of the first electrode 310, 320 and 330, which is exposed without being covered by the bank 340 in each sub pixel (P1, P2, P3), becomes the emission area. The bank 340 may be formed of an inorganic insulating film with a relatively small thickness, but not limited to this type. The bank 340 may be formed of an organic insulating film.

The emission layer 400 is formed on the first electrode 310, 320 and 330 and the bank 340. The emission layer 400 may be a white emission layer configured to emit white colored light. In this case, the emission layer 400 may be a common layer provided for the sub pixels (P1, P2, P3) in common.

The emission layer 400 may include the first stack (Stack1) configured to emit first colored light, the second stack (Stack2) configured to emit second colored light, and the charge generation layer (CGL) disposed between the first stack and the second stack.

The first stack (Stack1) is provided on the first electrode 310, 320 and 330. The first stack (Stack1) may be formed in a deposition structure obtained by sequentially depositing a hole injecting layer (HIL), a hole transporting layer (HTL), a first emitting layer (EML1) configured to emit first colored light, and an electron transporting layer (ETL), but not limited to this structure. The first emitting layer (EML1) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The second stack (Stack2) is provided on the charge generation layer (CGL). The second stack (Stack2) may be formed in a deposition structure obtained by sequentially depositing a hole transporting layer (HTL), a second emitting layer (EML2) configured to emit second colored light, an electron transporting layer (ETL), and an electro injecting layer (EIL), but not limited to this structure. The second emitting layer (EML2) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The second emitting layer (EML2) may emit light whose color is different from that of the first emitting layer (EML1). For example, the first emitting layer (EML1) may be the blue emitting layer configured to emit the blue colored light, and the second emitting layer (EML2) may be the yellow emitting layer configured to emit the yellow colored light. In another way, the first emitting layer (EML1) may be the blue emitting layer configured to emit the blue colored light, and the second emitting layer (EML2) may be the red emitting layer configured to emit the red colored light, and the green emitting layer configured to emit the green colored light.

The charge generation layer (CGL) may be formed in a deposition structure obtained by depositing an N-type charge generation layer for providing an electron to the first stack (Stack1), and a P-type charge generation layer for providing a hole to the second stack (Stack2).

The emission layer 400 may be provided with the disconnected area (BA) in which the first stack (Stack1) and the charge generation layer (CGL) are disconnectedly provided due to the step difference H1 of the bankwall 350. In this case, the disconnected area (BA) is provided on the bank 340, and is not overlapped with the bankwall 350.

Meanwhile, the second stack (Stack2) of the emission layer 400 is connectedly provided in the disconnected area (BA) without any disconnection. That is, unlike the first stack (Stack1) and the charge generation layer (CGL), the second stack (Stack2) of the emission layer 400 is connectedly provided between the sub pixels (P1, P2, P3).

Third Embodiment

Figure 9:
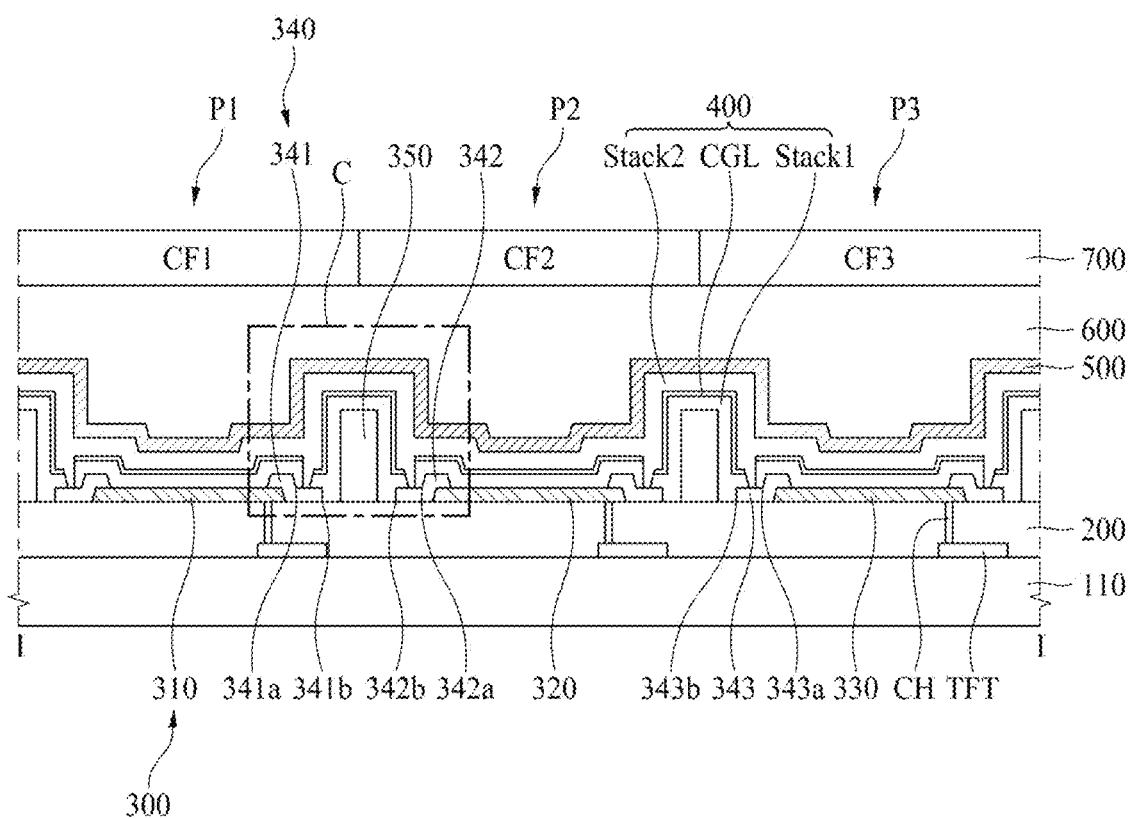
FIG. 9 is a cross sectional view illustrating a third embodiment along I-I of FIG. 1.
Figure 10:
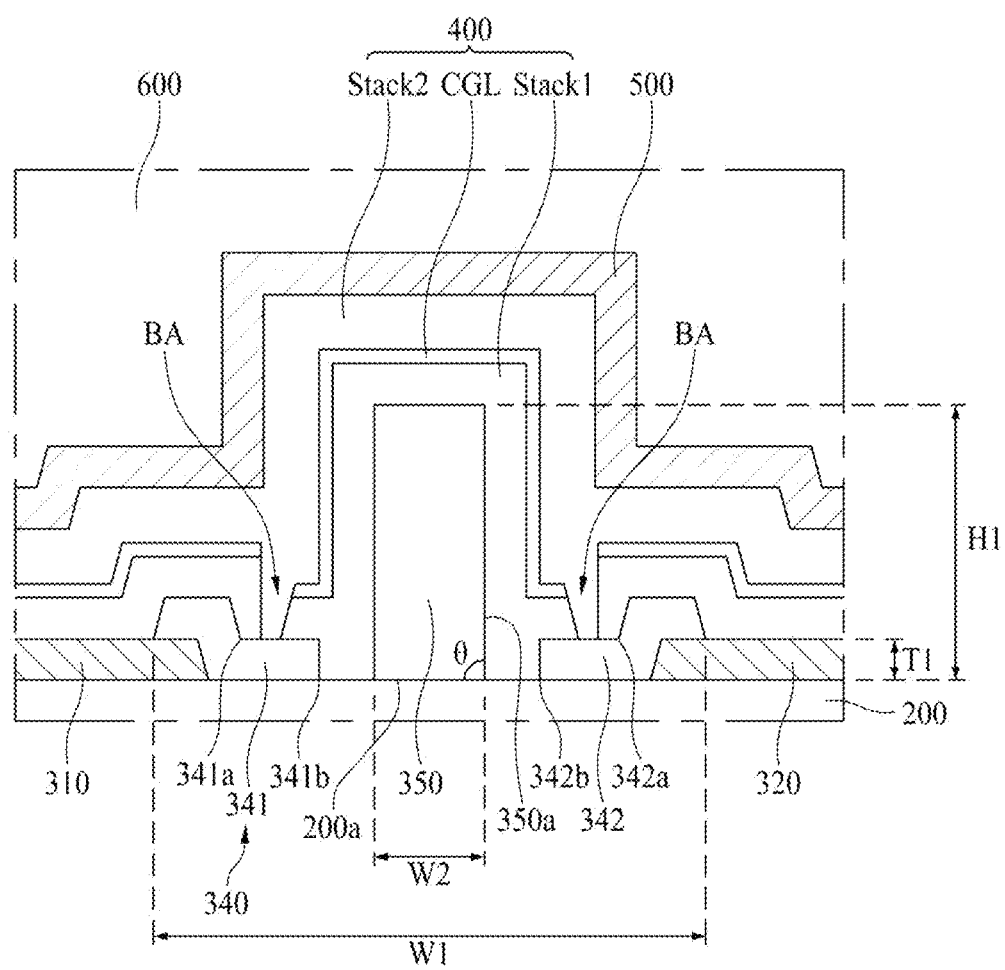
FIG. 10 is an expanded view illustrating "C" of FIG. 9.

FIG. 9 is a cross sectional view illustrating a third embodiment along I-I of FIG. 1. FIG. 10 is an expanded view illustrating "C" of FIG. 9.

Referring to FIGS. 9 and 10, the display device 100 according to the third embodiment of the present disclosure includes a substrate 110, a circuit device layer 200, a first electrode 300, a bank 340, a bankwall 350, an emission layer 400, a second electrode 500, an encapsulation layer 600, and a color filter 700.

Except the bank 340, the bankwall 350, and the emission layer 400, other structures of the display device 100 according to the third embodiment of the present disclosure are the same as those of the display device according to the first embodiment of the present disclosure shown in FIGS. 1 to 4. Hereinafter, a detailed description for the substrate 110, the circuit device layer 200, the first electrode 300, the second electrode 500, the encapsulation layer 600, and the color filter 700 in the display device 100 according to the third embodiment of the present disclosure will be omitted.

The bank 340 may be provided to cover the periphery of each first electrode 310, 320 and 330 on the first electrode 310, 320 and 330. Accordingly, it is possible to prevent a current from being concentrated on an end of the first electrode 310, 320 and 330, to thereby prevent a problem related with a deterioration of an emission efficiency.

Also, the bank 340 may be provided with an opening area for exposing the circuit device layer 200 between the sub pixels (P1, P2, P3).

In detail, the bank 340 may include a first bank 341 provided to cover the periphery of the first electrode 310 of the first sub pixel (P1), a second bank 342 provided to cover the periphery of the first electrode 320 of the second sub pixel (P2), and a third bank 343 provided to cover the periphery of the first electrode 330 of the third sub pixel (P3).

In the display device 100 according to the third embodiment of the present disclosure, the first bank 341 and the second bank 342 are spaced apart from each other, whereby the opening area for exposing the circuit device layer 200 may be formed.

Also, in the display device 100 according to the third embodiment of the present disclosure, the second bank 342 and the third bank 343 are spaced apart from each other, whereby the opening area for exposing the circuit device layer 200 may be formed.

The bank 340 defines an emission area in each of the plurality of sub pixels (P1, P2, P3). That is, an exposed area of the first electrode 310, 320 and 330, which is exposed without being covered by the bank 340 in each sub pixel (P1, P2, P3), becomes the emission area. The bank 340 may be formed of an inorganic insulating film with a relatively small thickness, but not limited to this type. The bank 340 may be formed of an organic insulating film.

The bankwall 350 is formed on the circuit device layer 200. In this case, the bankwall 350 is formed between the first electrodes 310, 320 and 330. Also, the bankwall 350 is formed between the banks 341, 342 and 343. That is, the bankwall 350 may be formed in the opening area of the bank 340.

The bankwall 350 is appropriate for forming a disconnected area (BA), in which a first stack (Stack1) of the emission layer 400, and more particularly, a first emission layer (EML1) and a charge generation layer (CGL) are disconnectedly provided, on the bank 340 provided between the sub pixels (P1, P2, P3).

In an exemplary embodiment, the bankwall 350 is appropriate for forming a disconnected area (BA), in which a first stack (Stack1) of the emission layer 400, and more particularly, a first emission layer (EML1) and a charge generation layer (CGL) are disconnectedly provided, on the bank 340 provided between the sub pixels (P1, P2, P3), by means of having an appropriate width and/or height.

The bankwall 350 may have a width (W2) which is smaller than a width (W1) of the bank 340. According to one embodiment of the present disclosure, the width (W2) of the bankwall 350 may be ⅕ to ⅔ of the width (W1) of the bank 340.

If the width (W2) of the bankwall 350 is smaller than ⅕ of the width (W1) of the bank 340 or larger than ⅔ of the width (W1) of the bank 340, the first stack (Stack1) and the charge generation layer (CGL) of the emission layer 400 may be connectedly provided between the sub pixels (P1, P2, P3). Also, the first stack (Stack1) and the charge generation layer (CGL) of the emission layer 400 may be non-uniformly deposited in the emission area. Thus, a leakage current may be generated between the neighboring sub pixels (P1, P2, P3), and a luminance may be non-uniform in the sub pixel (P1, P2, P3).

In the display device 100 according to the third embodiment of the present disclosure, the width (W2) of the bankwall 350 may be ⅕ to ⅔ of the width (W1) of the bank 340 so that it is possible to prevent a leakage current, and to realize a uniform luminance.

Also, the bankwall 350 may have a height (H1) which is smaller than the width (W1) of the bank 340. According to one embodiment of the present disclosure, the height (H1) of the bankwall 350 may be a value obtained by adding a thickness (T1) of the bank 340 to 1/10 to ½ of the width (W1) of the bank 340. If the height (H1) of the bankwall 350 is smaller than the value obtained by adding the thickness (T1) of the bank 340 to 1/10 of the width (W1) of the bank 340, the first stack (Stack1) and the charge generation layer (CGL) of the emission layer 400 may be connectedly provided between the sub pixels (P1, P2, P3). Meanwhile, if the height (H1) of the bankwall 350 is larger than the value obtained by adding the thickness (T1) of the bank 340 to ½ of the width (W1) of the bank 340, the first stack (Stack1) and the charge generation layer (CGL) included in the emission layer 400 may be disconnectedly provided on the first electrode 310, 320 and 330 which is exposed without being covered by the bank 340. That is, the disconnected area (BA), in which the first stack (Stack1) and the charge generation layer (CGL) included in the emission layer 400 are disconnectedly provided, is generated in the emission area, and thus the light emission is not generated in some portions of the emission area, whereby a defect might occur.

In the display device 100 according to the third embodiment of the present disclosure, the height (H1) of the bankwall 350 is to be the value obtained by adding the thickness (T1) of the bank 340 to 1/10 to ½ of the width (W1) of the bank 340, whereby the first stack (Stack1) and the charge generation layer (CGL) included in the emission layer 400 are disconnectedly provided in the non-emission area, to thereby prevent an occurrence of a leakage current.

Meanwhile, the bankwall 350 may have an inclination angle (θ) of 60° to 90°. Herein, the inclination angle indicates an angle obtained between a lateral surface 350a of the bankwall 350 and an upper surface 200a of the circuit device layer 200.

If the inclination angle (θ) of the bankwall 350 is less than 60°, the angle between the bankwall 350 and the circuit device layer 200 is gentle so that the bank 340 formed on the bankwall 350 has a gentle angle. Accordingly, the first stack (Stack1) and the charge generation layer (CGL) of the emission layer 400 deposited on the bank 340 may be connectedly provided. That is, the disconnected area (BA), in which the first stack (Stack1) and the charge generation layer (CGL) included in the emission layer 400 are provided disconnectedly, is not generated.

Meanwhile, if the inclination angle (θ) of the bankwall 350 is larger than 90°, the bankwall 350 has a reversed tapered structure so that the bank 340 formed on the bankwall 350, and the first stack (Stack1) and the charge generation layer (CGL) included in the emission layer 400, which are deposited on the bankwall 350, may be disconnectedly provided on the bankwall 350. Also, a second stack (Stack2) of the emission layer 400 and the second electrode 500 may be disconnectedly provided on the bankwall 350. In this case, the second electrode 500 may be disconnectedly provided on the bankwall 350, and may be provided on the charge generation layer (CGL) exposed without being covered by the second emission layer (EML2). Accordingly, the second electrode 500 and the charge generation layer (CGL) are electrically connected with each other, whereby a defect might occur.

The bankwall 350 may be formed of an inorganic material, for example, silicon nitride, aluminum nitride, zirconium nitride, titanium nitride, hafnium nitride, tantalum nitride, silicon oxide, aluminum oxide, or titanium oxide, but not limited to these materials. If the bankwall 350 is formed of the inorganic material, the bankwall 350 may be manufactured together with a protection film of the circuit device layer 200, at the same time. The circuit device layer 200 may include the protection film provided on a thin film transistor and configured to protect the thin film transistor. The bankwall 350 and the protection film of the circuit device layer 200 may be formed of the same material, and may be manufactured at the same time.

In another way, the bankwall 350 may be formed of an organic material, for example, acryl resin, epoxy resin, phenolic resin, polyamide resin, or polyimide resin. If the bankwall 350 is formed of the organic material, the bankwall 350 may be manufactured together with a planarization film of the circuit device layer 200, at the same time. The circuit device layer 200 may include the planarization layer provided on the thin film transistor and configured to planarize the step difference caused by the thin film transistor. The bankwall 350 and the planarization film of the circuit device layer 200 may be formed of the same material, and may be manufactured at the same time.

In the display device 100 according to the third embodiment of the present disclosure, as described above, the bankwall 350 is formed of the same material as that of the protection film or planarization film of the circuit device layer 200, and is manufactured together with the protection film or planarization film of the circuit device layer 200, at the same time. Thus, it is possible to manufacture the bankwall 350 without an additional process.

Meanwhile, the bankwall 350 may be formed of a metal material with high reflectance such as aluminum (Al). If the bankwall 350 is formed of the metal material, light transferred from any one sub pixel to another neighboring sub pixel is reflected on the bankwall 350 in the display device 100 according to the third embodiment of the present disclosure so that it is possible to prevent the light from being mixed between the sub pixels (P1, P2, P3). Also, light emitted from the sub pixel (P1, P2, P3) is reflected toward a front direction so that it is possible to improve a light efficiency and to reduce a power consumption.

The emission layer 400 is formed on the first electrode 310, 320 and 330, the bank 340, and the bankwall 350. The emission layer 400 may be a white emission layer configured to emit white colored light. In this case, the emission layer 400 may be a common layer provided for the sub pixels (P1, P2, P3) in common.

The emission layer 400 may include the first stack (Stack1) configured to emit first colored light, the second stack (Stack2) configured to emit second colored light, and the charge generation layer (CGL) disposed between the first stack and the second stack.

The first stack (Stack1) is provided on the first electrode 310, 320 and 330. The first stack (Stack1) may be formed in a deposition structure obtained by sequentially depositing a hole injecting layer (HIL), a hole transporting layer (HTL), a first emitting layer (EML1) configured to emit first colored light, and an electron transporting layer (ETL), but not limited to this structure. The first emitting layer (EML1) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The second stack (Stack2) is provided on the charge generation layer (CGL). The second stack (Stack2) may be formed in a deposition structure obtained by sequentially depositing a hole transporting layer (HTL), a second emitting layer (EML2) configured to emit second colored light, an electron transporting layer (ETL), and an electro injecting layer (EIL), but not limited to this structure. The second emitting layer (EML2) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The second emitting layer (EML2) may emit light whose color is different from that of the first emitting layer (EML1). For example, the first emitting layer (EML1) may be the blue emitting layer configured to emit the blue colored light, and the second emitting layer (EML2) may be the yellow emitting layer configured to emit the yellow colored light. In another way, the first emitting layer (EML1) may be the blue emitting layer configured to emit the blue colored light, and the second emitting layer (EML2) may be the red emitting layer configured to emit the red colored light, and the green emitting layer configured to emit the green colored light.

The charge generation layer (CGL) may be formed in a deposition structure obtained by depositing an N-type charge generation layer for providing an electron to the first stack (Stack1), and a P-type charge generation layer for providing a hole to the second stack (Stack2).

The emission layer 400 may be provided with the disconnected area (BA) in which the first stack (Stack1) and the charge generation layer (CGL) are disconnectedly provided due to the step difference H1 of the bankwall 350. In this case, the disconnected area (BA) may be provided on the bank 340. In more detail, each of the first to third banks 341, 342 and 343 may include a groove portion 341a, 342a and 343a which is formed by the step difference of the first electrode 310, 320 and 330, and a stepped portion 341b, 342b and 343b which is formed between the first electrode 310, 320 and 330 and the bankwall 350. The groove portion 341a, 342a and 343a and the stepped portion 341b, 342b and 343b in each of the first to third banks 341, 342 and 343 induce the formation of disconnected area (BA) between the groove portion 341a, 342a and 343a and the bankwall 350, instead of the formation of disconnected area (BA) on the first electrode 310, 320 and 330.

As shown in FIG. 9 or FIG. 10, the disconnected area (BA) is formed between the groove portion 341a, 342a and 343a and the stepped portion 341b, 342b and 343b in each of the first to third banks 341, 342 and 343, but not limited to this structure. According to another embodiment of the present disclosure, the disconnected area (BA) is formed between the bankwall 350 and the stepped portion 341b, 342b and 343b in each of the first to third banks 341, 342 and 343.

However, even in these cases, the disconnected area (BA) may be spaced apart from the bankwall 350. The first stack (Stack1) and the charge generation layer (CGL) included in the emission layer 400 may cover the bankwall 350, and may be disconnected at a predetermined point corresponding to an extending point by a predetermined length from the bankwall 350 to the first electrode 310, 320 and 330.

Meanwhile, the second stack (Stack2) of the emission layer 400 may be connectedly provided in the disconnected area (BA). That is, unlike the first stack (Stack1) and the charge generation layer (CGL), the second stack (Stack2) of the emission layer 400 may be connectedly provided between the sub pixels (P1, P2, P3) without being disconnectedly provided.

Fourth Embodiment

Figure 11:
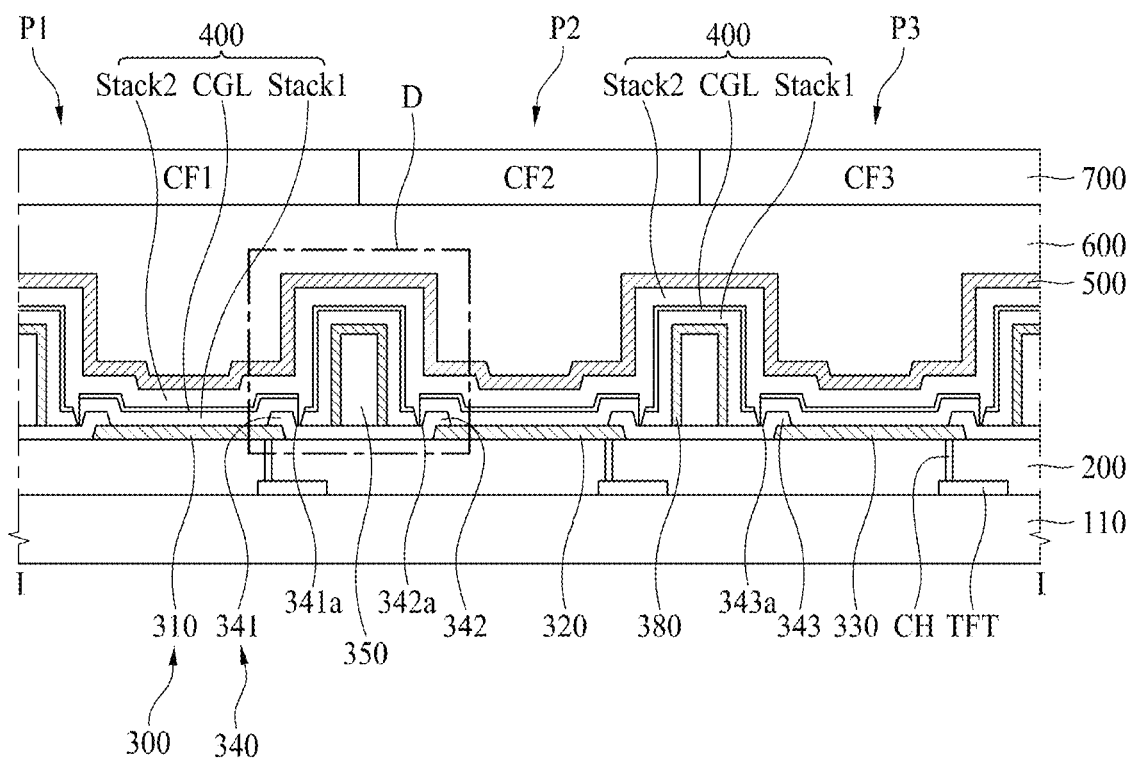
FIG. 11 is a cross sectional view illustrating a fourth embodiment along I-I of FIG. 1.
Figure 12:
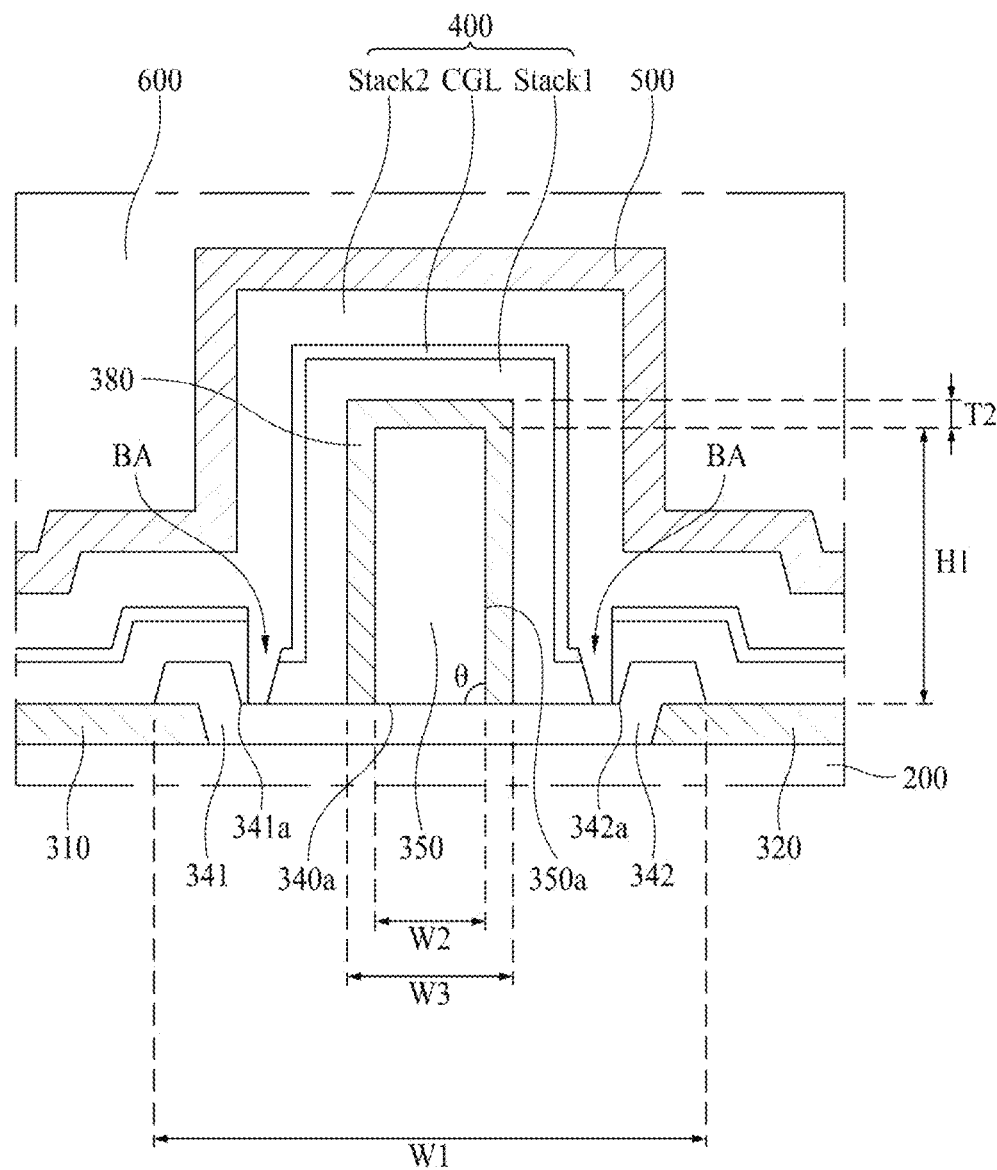
FIG. 12 is an expanded view illustrating "D" of FIG. 11.

FIG. 11 is a cross sectional view illustrating a fourth embodiment along I-I of FIG. 1. FIG. 12 is an expanded view illustrating "D" of FIG. 11.

Referring to FIGS. 11 and 12, the display device 100 according to the fourth embodiment of the present disclosure includes a substrate 110, a circuit device layer 200, a first electrode 300, a bank 340, a bankwall 350, a reflective film 380, an emission layer 400, a second electrode 500, an encapsulation layer 600, and a color filter 700.

Except the reflective film 380 and the bankwall 350, other structures of the display device 100 according to the fourth embodiment of the present disclosure are the same as those of the display device according to the first embodiment of the present disclosure shown in FIGS. 1 to 4. Hereinafter, a detailed description for the substrate 110, the circuit device layer 200, the first electrode 300, the bank 340, the emission layer 400, the second electrode 500, the encapsulation layer 600, and the color filter 700 in the display device 100 according to the fourth embodiment of the present disclosure will be omitted.

The bankwall 350 is formed on the bank 340. In this case, the bankwall 350 is formed between each of the first electrodes 310, 320 and 330. The bankwall 350 is appropriate for forming a disconnected area (BA), in which a first stack (Stack1) of the emission layer 400, and more particularly, a first emission layer (EML1) and a charge generation layer (CGL) are disconnectedly provided, on the bank 340 provided between the sub pixels (P1, P2, P3).

In an exemplary embodiment, the bankwall 350 is appropriate for forming a disconnected area (BA), in which a first stack (Stack1) of the emission layer 400, and more particularly, a first emission layer (EML1) and a charge generation layer (CGL) are disconnectedly provided, on the bank 340 provided between the sub pixels (P1, P2, P3), by means of having an appropriate width and/or height.

The bankwall 350 may have a width (W2) which is smaller than a width (W1) of the bank 340. According to one embodiment of the present disclosure, the width (W2) of the bankwall 350 may have a value obtained by subtracting double of a thickness (T2) of the reflective film 380 from ⅕ to ⅔ of the width (W1) of the bank 340. That is, a width (W3) of an area comprising the bankwall 350 and the reflective film 380 may be ⅕ to ⅔ of the width (W1) of the bank 340.

If the width (W3) of the area comprising the bankwall 350 and the reflective film 380 is smaller than ⅕ of the width (W1) of the bank 340 or larger than ⅔ of the width (W1) of the bank 340, the first stack (Stack1) and the charge generation layer (CGL) of the emission layer 400 may be connectedly provided between the sub pixels (P1, P2, P3). Also, the first stack (Stack1) and the charge generation layer (CGL) of the emission layer 400 may be non-uniformly deposited in an emission area. Thus, a leakage current may be generated between the neighboring sub pixels (P1, P2, P3), and a luminance may be non-uniform in the sub pixel (P1, P2, P3).

In the display device 100 according to the fourth embodiment of the present disclosure, the width (W3) of the area comprising the bankwall 350 and the reflective film 380 may be ⅕ to ⅔ of the width (W1) of the bank 340 so that it is possible to prevent a leakage current, and to realize a uniform luminance.

Also, the bankwall 350 may have a height (H1) which is smaller than the width (W1) of the bank 340. According to one embodiment of the present disclosure, the height (H1) of the bankwall 350 may be a value obtained by subtracting a thickness (T2) of the reflective film 380 from ¹⁄₁₀ to ½ of the width (W1) of the bank 340. That is, a height (H2) of the area comprising the bankwall 350 and the reflective film 380 may be ¹⁄₁₀ to ½ of the width (W1) of the bank 340.

If the height (H2) of the area comprising the bankwall 350 and the reflective film 380 is smaller than ¹⁄₁₀ of the width (W1) of the bank 340, the first stack (Stack1) and the charge generation layer (CGL) of the emission layer 400 may be connectedly provided between the sub pixels (P1, P2, P3). Meanwhile, if the height (H2) of the area comprising the bankwall 350 and the reflective film 380 is larger than ½ of the width (W1) of the bank 340, the first stack (Stack1) and the charge generation layer (CGL) included in the emission layer 400 may be disconnectedly provided on the first electrode 310, 320 and 330 which is exposed without being covered by the bank 340. That is, the disconnected area (BA), in which the first stack (Stack1) and the charge generation layer (CGL) included in the emission layer 400 are disconnectedly provided, is generated in the emission area, and thus the light emission is not generated in some portions of the emission area, whereby a defect might occur.

In the display device 100 according to the fourth embodiment of the present disclosure, the height (H2) of the area comprising the bankwall 350 and the reflective film 380 is to be ¹⁄₁₀ to ½ of the width (W1) of the bank 340, whereby the first stack (Stack1) and the charge generation layer (CGL) included in the emission layer 400 are disconnectedly provided in the non-emission area, to thereby prevent an occurrence of a leakage current.

Meanwhile, the bankwall 350 may have an inclination angle (θ) of 60° to 90°. Herein, the inclination angle indicates an angle obtained between a lateral surface 350a of the bankwall 350 and an upper surface 340a of the bank 340.

If the inclination angle (θ) of the bankwall 350 is less than 60°, the angle between the bankwall 350 and the bank 340 is gentle so that the first stack (Stack1) and the charge generation layer (CGL) of the emission layer 400 deposited on the bankwall 350 and the bank 340 may be connectedly provided. That is, the disconnected area (BA), in which the first stack (Stack1) and the charge generation layer (CGL) included in the emission layer 400 are provided disconnectedly, is not generated.

Meanwhile, if the inclination angle (θ) of the bankwall 350 is larger than 90°, the bankwall 350 has a reversed tapered structure so that the first stack (Stack1) and the charge generation layer (CGL) included in the emission layer 400 may be disconnectedly provided on the bankwall 350. If the bankwall 350 has the reversed tapered structure, a second stack (Stack2) of the emission layer 400 and the second electrode 500 may be disconnectedly provided on the bankwall 350. In this case, the second electrode 500 may be disconnectedly provided on the bankwall 350, and may be provided on the charge generation layer (CGL) exposed without being covered by the second emission layer (EML2). Accordingly, the second electrode 500 and the charge generation layer (CGL) are electrically connected with each other, whereby a defect might occur.

The bankwall 350 may be formed of an inorganic material, for example, silicon nitride, aluminum nitride, zirconium nitride, titanium nitride, hafnium nitride, tantalum nitride, silicon oxide, aluminum oxide, or titanium oxide, but not limited to these materials. The bankwall 350 may be formed of an organic material, for example, acryl resin, epoxy resin, phenolic resin, polyamide resin, or polyimide resin.

The reflective film 380 may be formed on the bankwall 350. The reflective film 380 may be formed of a metal material with high reflectance, to thereby reflect the light. In the display device 100 according to the fourth embodiment of the present disclosure, light transferred from any one sub pixel to another neighboring sub pixel is reflected on the reflective film 380 so that it is possible to prevent the light from being mixed between the sub pixels (P1, P2, P3). Also, light emitted from the sub pixel (P1, P2, P3) is reflected toward a front direction so that it is possible to improve a light efficiency, and to reduce a power consumption.

Fifth Embodiment

Figure 13:
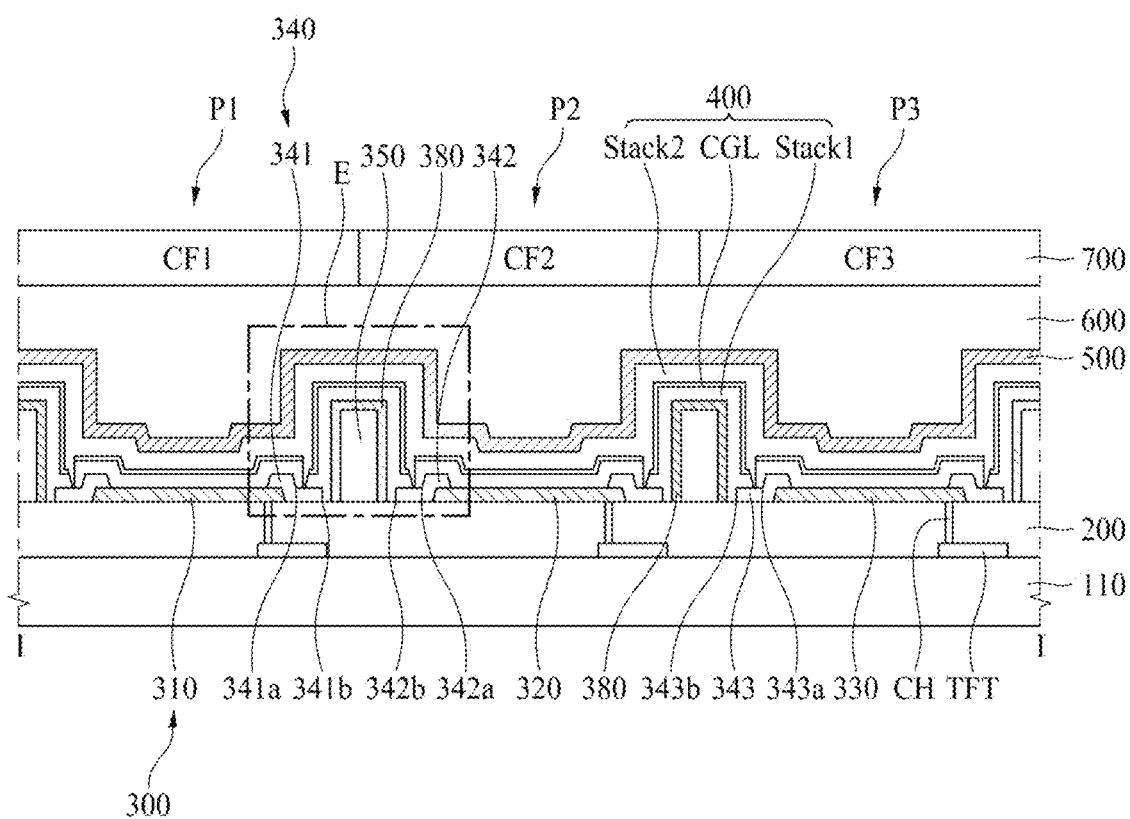
FIG. 13 is a cross sectional view illustrating a fifth embodiment along I-I of FIG. 1.
Figure 14:
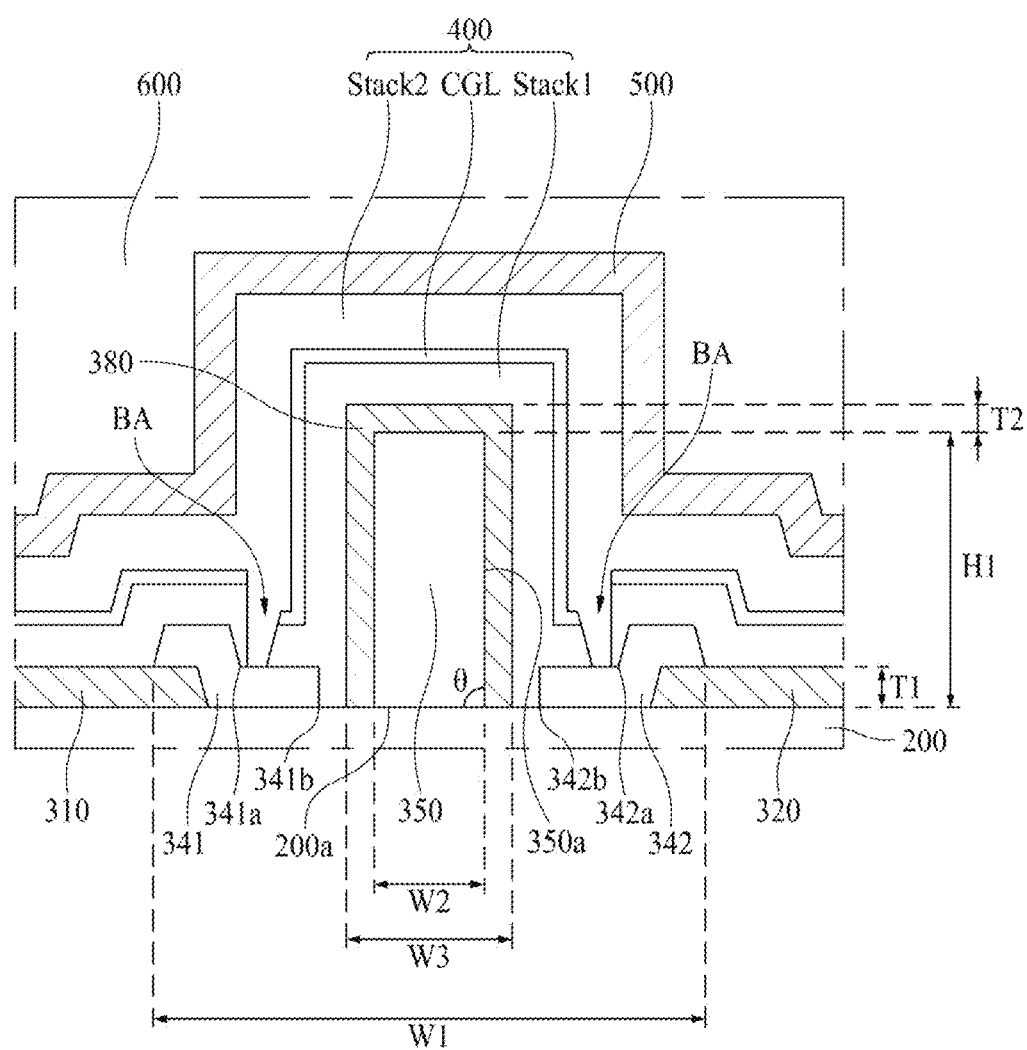
FIG. 14 is an expanded view illustrating "E" of FIG. 13.

FIG. 13 is a cross sectional view illustrating a fifth embodiment along I-I of FIG. 1. FIG. 14 is an expanded view illustrating "E" of FIG. 13.

Referring to FIGS. 13 and 14, the display device 100 according to the fifth embodiment of the present disclosure includes a substrate 110, a circuit device layer 200, a first electrode 300, a bank 340, a bankwall 350, a reflective film 380, an emission layer 400, a second electrode 500, an encapsulation layer 600, and a color filter 700.

Except the reflective film 380, the bank 340, the bankwall 350, and the emission layer 400, other structures of the display device 100 according to the fifth embodiment of the present disclosure are the same as those of the display device according to the first embodiment of the present disclosure shown in FIGS. 1 to 4. Hereinafter, a detailed description for the substrate 110, the circuit device layer 200, the first electrode 300, the second electrode 500, the encapsulation layer 600, and the color filter 700 in the display device 100 according to the fifth embodiment of the present disclosure will be omitted.

The bank 340 may be provided to cover the periphery of each first electrode 310, 320 and 330 on the first electrode 310, 320 and 330. Accordingly, it is possible to prevent a current from being concentrated on an end of the first electrode 310, 320 and 330, to thereby prevent a problem related with a deterioration of an emission efficiency.

Also, the bank 340 may be provided with an opening area for exposing the circuit device layer 200 between the sub pixels (P1, P2, P3).

In detail, the bank 340 may include a first bank 341 provided to cover the periphery of the first electrode 310 of the first sub pixel (P1), a second bank 342 provided to cover the periphery of the first electrode 320 of the second sub pixel (P2), and a third bank 343 provided to cover the periphery of the first electrode 330 of the third sub pixel (P3).

In the display device 100 according to the fifth embodiment of the present disclosure, the first bank 341 and the second bank 342 are spaced apart from each other, whereby the opening area for exposing the circuit device layer 200 may be formed.

Also, in the display device 100 according to the fifth embodiment of the present disclosure, the second bank 342 and the third bank 343 are spaced apart from each other, whereby the opening area for exposing the circuit device layer 200 may be formed.

The bank 340 defines an emission area in each of the plurality of sub pixels (P1, P2, P3). That is, an exposed area of the first electrode 310, 320 and 330, which is exposed without being covered by the bank 340 in each sub pixel (P1, P2, P3), becomes the emission area. The bank 340 may be formed of an inorganic insulating film with a relatively small thickness, but not limited to this type. The bank 340 may be formed of an organic insulating film.

The bankwall 350 is formed on the circuit device layer 200. In this case, the bankwall 350 is formed between the first electrodes 310, 320 and 330. Also, the bankwall 350 is formed between the banks 341, 342 and 343. That is, the bankwall 350 may be formed in the opening area of the bank 340.

The bankwall 350 is appropriate for forming a disconnected area (BA), in which a first stack (Stack1) of the emission layer 400, and more particularly, a first emission layer (EML1) and a charge generation layer (CGL) are disconnectedly provided, on the bank 340 provided between the sub pixels (P1, P2, P3).

In an exemplary embodiment, the bankwall 350 is appropriate for forming a disconnected area (BA), in which a first stack (Stack1) of the emission layer 400, and more particularly, a first emission layer (EML1) and a charge generation layer (CGL) are disconnectedly provided, on the bank 340 provided between the sub pixels (P1, P2, P3), by means of having an appropriate width and height.

The bankwall 350 may have a width (W2) which is smaller than a width (W1) of the bank 340. According to one embodiment of the present disclosure, the width (W2) of the bankwall 350 may have a value obtained by subtracting double of a thickness (T2) of the reflective film 380 from ⅕ to ⅔ of the width (W1) of the bank 340. That is, a width (W3) of an area comprising the bankwall 350 and the reflective film 380 may be ⅕ to ⅔ of the width (W1) of the bank 340.

If the width (W3) of the area comprising the bankwall 350 and the reflective film 380 is smaller than ⅕ of the width (W1) of the bank 340 or larger than ⅔ of the width (W1) of the bank 340, the first stack (Stack1) and the charge generation layer (CGL) of the emission layer 400 may be connectedly provided between the sub pixels (P1, P2, P3). Also, the first stack (Stack1) and the charge generation layer (CGL) of the emission layer 400 may be non-uniformly deposited in the emission area. Thus, a leakage current may be generated between the neighboring sub pixels (P1, P2, P3), and a luminance may be non-uniform in the sub pixel (P1, P2, P3).

In the display device 100 according to the fifth embodiment of the present disclosure, the width (W3) of the area comprising the bankwall 350 and the reflective film 380 is to be ⅕ to ⅔ of the width (W1) of the bank 340 so that it is possible to prevent a leakage current and to realize a uniform luminance.

Also, the bankwall 350 may have a height (H1) which is smaller than the width (W1) of the bank 340. According to one embodiment of the present disclosure, the height (H1) of the bankwall 350 may have a result value obtained by subtracting a thickness (T2) of the reflective film 380 from an addition value obtained by adding a thickness (T1) of the bank 340 to ¹⁄₁₀ to ½ of the width (W1) of the bank 340. That is, a height (H2) of the area comprising the bankwall 350 and the reflective film 380 may be the addition value obtained by adding the thickness (T1) of the bank 340 to ¹⁄₁₀ to ½ of the width (W1) of the bank 340.

If the height (H2) of the area comprising the bankwall 350 and the reflective film 380 is smaller than the addition value obtained by adding the thickness (T1) of the bank 340 to ¹⁄₁₀ of the width (W1) of the bank 340, the first stack (Stack1) and the charge generation layer (CGL) of the emission layer 400 may be connectedly provided between the sub pixels (P1, P2, P3). Meanwhile, if the height (H2) of the area comprising the bankwall 350 and the reflective film 380 is larger than the addition value obtained by adding the thickness (T1) of the bank 340 to ½ of the width (W1) of the bank 340, the first stack (Stack1) and the charge generation layer (CGL) included in the emission layer 400 may be disconnectedly provided on the first electrode 310, 320 and 330 which is exposed without being covered by the bank 340. That is, the disconnected area (BA), in which the first stack (Stack1) and the charge generation layer (CGL) included in the emission layer 400 are disconnectedly provided, is generated in the emission area, and thus the light emission is not generated in some portions of the emission area, whereby a defect might occur.

In the display device 100 according to the fifth embodiment of the present disclosure, the height (H2) of the area comprising the bankwall 350 and the reflective film 380 has the addition value obtained by adding the thickness (T1) of the bank 340 to ¹⁄₁₀ to ½ of the width (W1) of the bank 340, whereby the first stack (Stack1) and the charge generation layer (CGL) included in the emission layer 400 are disconnectedly provided in the non-emission area, to thereby prevent an occurrence of a leakage current.

Meanwhile, the bankwall 350 may have an inclination angle (θ) of 60° to 90°. Herein, the inclination angle indicates an angle obtained between a lateral surface 350a of the bankwall 350 and an upper surface 200a of the circuit device layer 200.

If the inclination angle (θ) of the bankwall 350 is less than 60°, the angle between the bankwall 350 and the circuit device layer 200 is gentle so that the bank 340 formed on the bankwall 350 has a gentle angle. Accordingly, the first stack (Stack1) and the charge generation layer (CGL) of the emission layer 400 deposited on the bank 340 may be connectedly provided. That is, the disconnected area (BA), in which the first stack (Stack1) and the charge generation layer (CGL) included in the emission layer 400 are provided disconnectedly, is not generated.

Meanwhile, if the inclination angle (θ) of the bankwall 350 is larger than 90°, the bankwall 350 has a reversed tapered structure so that the bank 340 formed on the bankwall 350, and the first stack (Stack1) and the charge generation layer (CGL) included in the emission layer 400, which are deposited on the bankwall 350, may be disconnectedly provided on the bankwall 350. Also, a second stack (Stack1) of the emission layer 400 and the second electrode 500 may be disconnectedly provided on the bankwall 350. In this case, the second electrode 500 may be disconnectedly provided on the bankwall 350, and may be provided on the charge generation layer (CGL) exposed without being covered by the second emission layer (EML2). Accordingly, the second electrode 500 and the charge generation layer (CGL) are electrically connected with each other, whereby a defect might occur.

The bankwall 350 may be formed of an inorganic material, for example, silicon nitride, aluminum nitride, zirconium nitride, titanium nitride, hafnium nitride, tantalum nitride, silicon oxide, aluminum oxide, or titanium oxide, but not limited to these materials. If the bankwall 350 is formed of the inorganic material, the bankwall 350 may be manufactured together with a protection film of the circuit device layer 200, at the same time. The circuit device layer 200 may include the protection film provided on a thin film transistor and configured to protect the thin film transistor. The bankwall 350 and the protection film of the circuit device layer 200 may be formed of the same material, and may be manufactured at the same time.

In another way, the bankwall 350 may be formed of an organic material, for example, acryl resin, epoxy resin, phenolic resin, polyamide resin, or polyimide resin. If the bankwall 350 is formed of the organic material, the bankwall 350 may be manufactured together with a planarization film of the circuit device layer 200, at the same time. The circuit device layer 200 may include the planarization layer provided on the thin film transistor and configured to planarize the step difference caused by the thin film transistor. The bankwall 350 and the planarization film of the circuit device layer 200 may be formed of the same material, and may be manufactured at the same time.

In the display device 100 according to the fifth embodiment of the present disclosure, as described above, the bankwall 350 is formed of the same material as that of the protection film or planarization film of the circuit device layer 200, and is manufactured together with the protection film or planarization film of the circuit device layer 200, at the same time. Thus, it is possible to manufacture the bankwall 350 without an additional process.

The reflective film 380 may be formed on the bankwall 350. The reflective film 380 may be formed of a metal material with high reflectance, to thereby reflect the light. In the display device 100 according to the fifth embodiment of the present disclosure, light transferred from any one sub pixel to another neighboring sub pixel is reflected on the reflective film 380 so that it is possible to prevent the light from being mixed between the sub pixels (P1, P2, P3). Also, light emitted from the sub pixel (P1, P2, P3) is reflected toward a front direction so that it is possible to improve a light efficiency and to reduce a power consumption.

The emission layer 400 is formed on the first electrode 310, 320 and 330, the bank 340, and the reflective film 380. The emission layer 400 may be a white emission layer configured to emit white colored light. In this case, the emission layer 400 may be a common layer provided for the sub pixels (P1, P2, P3) in common.

The emission layer 400 may include the first stack (Stack1) configured to emit first colored light, the second stack (Stack2) configured to emit second colored light, and the charge generation layer (CGL) disposed between the first stack and the second stack.

The first stack (Stack1) is provided on the first electrode 310, 320 and 330. The first stack (Stack1) may be formed in a deposition structure obtained by sequentially depositing a hole injecting layer (HIL), a hole transporting layer (HTL), a first emitting layer (EML1) configured to emit first colored light, and an electron transporting layer (ETL), but not limited to this structure. The first emitting layer (EML1) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The second stack (Stack2) is provided on the charge generation layer (CGL). The second stack (Stack2) may be formed in a deposition structure obtained by sequentially depositing a hole transporting layer (HTL), a second emitting layer (EML2) configured to emit second colored light, an electron transporting layer (ETL), and an electro injecting layer (EIL), but not limited to this structure. The second emitting layer (EML2) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The second emitting layer (EML2) may emit light whose color is different from that of the first emitting layer (EML1). For example, the first emitting layer (EML1) may be the blue emitting layer configured to emit the blue colored light, and the second emitting layer (EML2) may be the yellow emitting layer configured to emit the yellow colored light. In another way, the first emitting layer (EML1) may be the blue emitting layer configured to emit the blue colored light, and the second emitting layer (EML2) may be the red emitting layer configured to emit the red colored light, and the green emitting layer configured to emit the green colored light.

The charge generation layer (CGL) may be formed in a deposition structure obtained by depositing an N-type charge generation layer for providing an electron to the first stack (Stack1), and a P-type charge generation layer for providing a hole to the second stack (Stack2).

The emission layer 400 may be provided with the disconnected area (BA) in which the first stack (Stack1) and the charge generation layer (CGL) are disconnectedly provided due to the step difference H1 of the bankwall 350. In this case, the disconnected area (BA) may be provided on the bank 340. In more detail, each of the first to third banks 341, 342 and 343 may include a groove portion 341a, 342a and 343a which is formed by the step difference of the first electrode 310, 320 and 330, and a stepped portion 341b, 342b and 343b which is formed between the first electrode 310, 320 and 330 and the bankwall 350. The groove portion 341a, 342a and 343a and the stepped portion 341b, 342b and 343b in each of the first to third banks 341, 342 and 343 induce the formation of disconnected area (BA) between the groove portion 341a, 342a and 343a and the bankwall 350, instead of the formation of disconnected area (BA) on the first electrode 310, 320 and 330.

As shown in FIG. 13 or FIG. 14, the disconnected area (BA) is formed between the groove portion 341a, 342a and 343a and the stepped portion 341b, 342b and 343b in each of the first to third banks 341, 342 and 343, but not limited to this structure. According to another embodiment of the present disclosure, the disconnected area (BA) is formed between the bankwall 350 and the stepped portion 341b, 342b and 343b in each of the first to third banks 341, 342 and 343.

However, even in these cases, the disconnected area (BA) may be spaced apart from the bankwall 350. The first stack (Stack1) and the charge generation layer (CGL) included in the emission layer 400 may cover the bankwall 350, and then may be disconnected at a predetermined point corresponding to an extending point by a predetermined length from the bankwall 350 to the first electrode 310, 320 and 330.

Meanwhile, the second stack (Stack2) of the emission layer 400 may be connectedly provided in the disconnected area (BA). That is, unlike the first stack (Stack1) and the charge generation layer (CGL), the second stack (Stack2) of the emission layer 400 may be connectedly provided between the sub pixels (P1, P2, P3) without being disconnectedly provided.

Figure 15A:
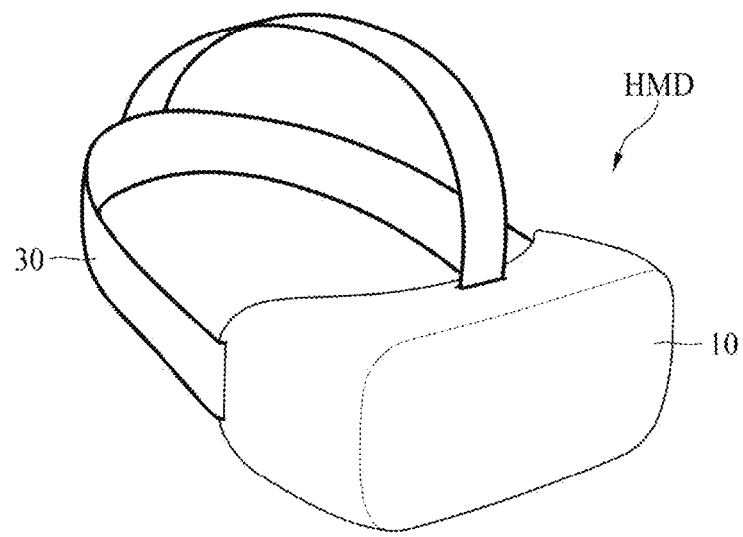
FIGS. 15A to 15C illustrate a display device according to another embodiment of the present disclosure, which relate to a head mounted display (HMD) device.
Figure 15B:
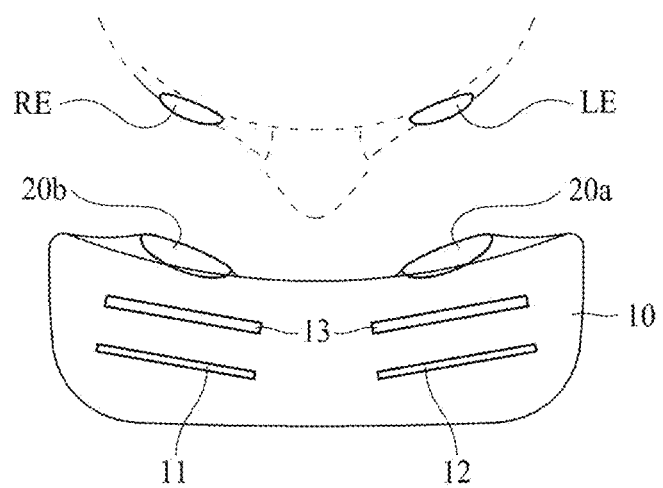
Figure 15C:
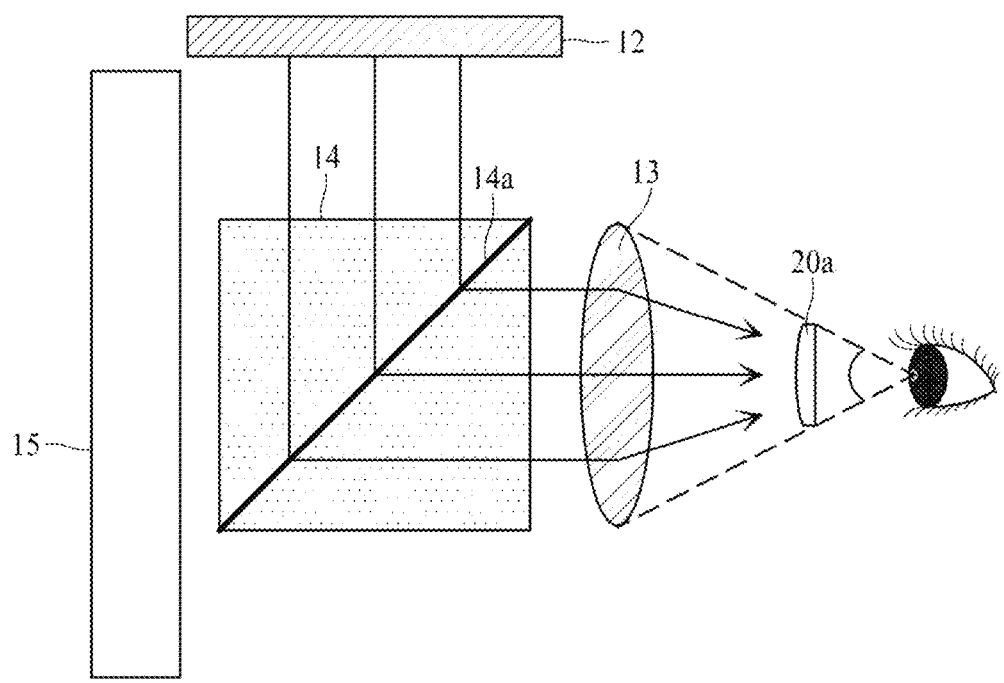

FIGS. 15A to 15C illustrate a display device according to another embodiment of the present disclosure, which relate to a head mounted display (HMD) device. FIG. 15A is a schematic perspective view, FIG. 15B is a schematic plane view of a virtual reality (VR) structure, and FIG. 15C is a cross sectional view of an augmented reality (AR) structure.

As shown in FIG. 15A, the head mounted display (HMD) device according to the present disclosure includes a receiving case 10, and a head mounted band 30.

A display device, a lens array, and an ocular eyepiece may be received in the inside of the receiving case 10.

The head mounted band 30 is fixed to the receiving case 10. In the drawings, the head mounted band 30 is configured to surround an upper surface and both lateral surfaces in a user's head, but not limited to this structure. For example, the head mounted band is provided to fix the head mounted display (HMD) device to a user's head, which may be substituted by an eyeglass-frame shape or a helmet-shaped structure.

As shown in FIG. 15B, the head mounted display (HMD) device of the virtual reality (VR) structure according to the present disclosure includes a left-eye display device 12, a right-eye display device 11, a lens array 13, a left-eye ocular eyepiece 20a, and a right-eye ocular eyepiece 20b.

The left-eye display device 12, the right-eye display device 11, the lens array 13, and the left-eye ocular eyepiece 20a, and the right-eye ocular eyepiece 20b are received in the aforementioned receiving case 10.

The same image may be displayed on the left-eye display device 12 and the right-eye display device 11. In this case, a user can watch a two-dimensional (2D) image. If an image for a left eye is displayed on the left-eye display device 12, and an image for a right eye is displayed on the right-eye display device 11, a user can watch a three-dimensional (3D) image. Each of the left-eye display device 12 and the right-eye display device 11 may be formed of the aforementioned display device shown in FIGS. 1 to 14. In this case, an upper portion corresponding to a surface for displaying an image in FIGS. 1 to 14, for example, the color filter 700 confronts the lens array 13.

The lens array 13 may be disposed between the left-eye ocular eyepiece 20a and the left-eye display device 12 while being apart from each of the left-eye ocular eyepiece 20a and the left-eye display device 12. That is, the lens array 13 may be positioned at the front of the left-eye ocular eyepiece 20a and at the rear of the left-eye display device 12. Also, the lens array 13 may be disposed between the right-eye ocular eyepiece 20b and the right-eye display device 11 while being apart from each of the right-eye ocular eyepiece 20b and the right-eye display device 11. That is, the lens array 13 may be positioned at the front of the right-eye ocular eyepiece 20b and at the rear of the right-eye display device 11.

The lens array 13 may be a micro lens array. The lens array 13 may be substituted by a pin hole array. Owing to the lens array 13, an image displayed on the left-eye display device 12 or the right-eye display device 11 may be expanded and perceived by a user.

A user's left eye (LE) may be positioned at the left-eye ocular eyepiece 20a, and a user's right eye (RE) may be positioned at the right-eye ocular eyepiece 20b.

As shown in FIG. 15C, the head mounted display (HMD) device of the augmented reality (AR) structure according to the present disclosure includes a left-eye display device 12, a lens array 13, a left-eye ocular eyepiece 20a, a transmissive reflecting portion 14, and a transmission window 15. FIG. 15C shows only the left-eye structure, for convenience of explanation. The right-eye structure is identical in structure to the left-eye structure.

The left-eye display device 12, the lens array 13, the left-eye ocular eyepiece 20a, the transmissive reflecting portion 14, and the transmission window 15 are received in the aforementioned receiving case 10.

The left-eye display device 12 may be disposed at one side of the transmissive reflecting portion 14, for example, an upper side of the transmissive reflecting portion 14 without covering the transmission window 15. Accordingly, an image may be provided to the transmissive reflecting portion 14 under the condition that an ambient background seen through the transmission window 15 is not covered by the left-eye display device 12.

The left-eye display device 12 may be formed of the display device shown in FIGS. 1 to 14. In this case, an upper portion corresponding to a surface for displaying an image in FIGS. 1 to 14, for example, the color filter 700 confronts the transmissive reflecting portion 14.

The lens array 13 may be provided between the left-eye ocular eyepiece 20a and the transmissive reflecting portion 14.

A user's left eye is positioned at the left-eye ocular eyepiece 20a.

The transmissive reflecting portion 14 is disposed between the lens array 13 and the transmission window 15. The transmissive reflecting portion 14 may include a reflection surface 14a which partially transmits some of light, and also reflects the remaining light. The reflection surface 14a is configured to guide an image, which is displayed on the left-eye display device 12, toward the lens array 13. Thus, a user can watch an image displayed on the left-eye display device 12 together with the ambient background through the transmission window 15. That is, a user can watch one image obtained by a virtual image overlaid with the ambient real background, to thereby realize an augmented reality (AR).

The transmission window 15 is disposed in front of the transmissive reflecting portion 14.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a substrate including:
      a first sub pixel; and
      a second sub pixel;
   first electrodes patterned in the respective first and second sub pixel on the substrate;

a bankwall provided between the first electrodes;

a bank provided to cover an end of the first electrode, the bank being configured to expose some portions of the first electrode;

an emission layer provided on the bankwall and the bank, the emission layer including:
 a first stack;
 a second stack; and
 a charge generation layer disposed between the first stack and the second stack; and a second electrode provided on the emission layer, wherein the emission layer includes a disconnected area in which the charge generation layer is discontinuous by a height of the bankwall, and wherein the disconnected area is spaced apart from the bankwall.

2. The display device according to claim 1, wherein the disconnected area is provided on the bank.

3. The display device according to claim 1, wherein a width of the bankwall is smaller than a width of the bank.

4. The display device according to claim 3, wherein the width of the bankwall is $1/10$ to $2/3$ of the width of the bank.

5. The display device according to claim 1, wherein the height of the bankwall is smaller than the width of the bank.

6. The display device according to claim 5, wherein the height of the bankwall is $1/10$ to $1/2$ of the width of the bank.

7. The display device according to claim 1, wherein the bank includes:
 a first bank configured to cover an end of the first electrode of the first sub pixel; and
 a second bank configured to cover an end of the first electrode of the second sub pixel.

8. The display device according to claim 7, wherein:
 the first bank and the second bank are connected with each other; and
 the bankwall is provided between the first bank and the second bank.

9. The display device according to claim 7, wherein:
 the first bank and the second bank are spaced apart from each other; and
 the bankwall is provided between the first bank and the second bank.

10. The display device according to claim 1, wherein the bankwall is formed of an inorganic material.

11. The display device according to claim 10, further comprising a reflective film provided on the bankwall.

12. The display device according to claim 1, wherein the bankwall is formed of a metal material.

13. The display device according to claim 1, wherein the first electrode is provided to expose some portions of the bankwall, while being disposed on the bankwall.

14. The display device according to claim 1, wherein the emission layer is provided with the first stack, which is disconnectedly provided in the disconnected area.

15. The display device according to claim 1, wherein the emission layer is provided with the second stack, which is connectedly provided in the disconnected area.

16. The display device according to claim 1, further comprising:
 a thin film transistor provided between the substrate and the first electrode; and
 an insulating film provided on the thin film transistor,
 wherein the bankwall and the insulating film are formed of the same material, and are manufactured at the same time.

17. The display device according to claim 1, wherein:
 the bankwall has an inclination angle of 60° to 90°; and
 the inclination angle indicates an angle obtained between a lateral surface of the bankwall and an upper surface of the bank.

18. The display device according to claim 1, wherein:
 the bankwall is provided on a circuit device layer included in the display device;
 the bankwall has an inclination angle of 60° to 90°; and
 the inclination angle indicates an angle obtained between a lateral surface of the bankwall and an upper surface of the circuit device layer.

* * * * *